United States Patent
Cho

(10) Patent No.: US 10,269,438 B2
(45) Date of Patent: Apr. 23, 2019

(54) NONVOLATILE MEMORY DEVICE FOR PERFORMING A PARTIAL READ OPERATION AND A METHOD OF READING THE SAME

(71) Applicant: SAMSUNG ELECTRONICS CO., LTD., Suwon-si, Gyeonggi-Do (KR)

(72) Inventor: Yongsung Cho, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/701,801

(22) Filed: Sep. 12, 2017

(65) Prior Publication Data
US 2018/0151234 A1 May 31, 2018

(30) Foreign Application Priority Data
Nov. 28, 2016 (KR) ........................ 10-2016-0159556

(51) Int. Cl.
*G11C 11/34* (2006.01)
*G11C 16/04* (2006.01)
*G11C 16/28* (2006.01)
*G11C 16/08* (2006.01)
*G11C 16/34* (2006.01)

(52) U.S. Cl.
CPC .......... *G11C 16/28* (2013.01); *G11C 16/0483* (2013.01); *G11C 16/08* (2013.01); *G11C 16/3427* (2013.01)

(58) Field of Classification Search
CPC ...... G11C 16/28; G11C 16/0483; G11C 16/08; G11C 16/3427
See application file for complete search history.

(56) References Cited

U.S. PATENT DOCUMENTS

| | | | |
|---|---|---|---|
| 7,679,133 B2 | 3/2010 | Son et al. | |
| 7,697,333 B2 | 4/2010 | Isobe | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,885,411 B2 | 11/2014 | Kamigaichi | |
| 8,937,833 B2 | 1/2015 | Lee | |
| 9,135,958 B2 | 9/2015 | Lee et al. | |
| 2008/0055983 A1 | 3/2008 | Kurata et al. | |
| 2009/0135656 A1 | 5/2009 | Park | |
| 2009/0279356 A1* | 11/2009 | Hashimoto | G11C 11/5628 365/185.03 |

(Continued)

*Primary Examiner* — Toan K Le
(74) *Attorney, Agent, or Firm* — F. Chau & Associates, LLC

(57) ABSTRACT

A nonvolatile memory device includes a first cell string including a first dummy cell and connected to a selected string select line, a second cell string including a second dummy cell and connected to the selected string select line, a page buffer circuit configured to select one of the first and second cell strings to read data in a read operation, and a control logic circuit configured to apply a first bit line voltage to a bit line connected to the selected one of the first and second cell strings and a second bit line voltage to a bit line connected to an unselected one of the first and second cell strings in the read operation. The control logic circuit turns off the second dummy cell when the first cell string is selected and turns off the first dummy cell when the second cell string is selected.

20 Claims, 18 Drawing Sheets

(56) References Cited

U.S. PATENT DOCUMENTS

| | | | |
|---|---|---|---|
| 2011/0233648 A1 | 9/2011 | Seol et al. | |
| 2013/0070529 A1* | 3/2013 | Park | G11C 16/10 |
| | | | 365/185.11 |
| 2014/0241064 A1* | 8/2014 | Lee | G11C 16/0483 |
| | | | 365/185.17 |
| 2016/0163395 A1 | 6/2016 | Suito | |

* cited by examiner

NONVOLATILE MEMORY DEVICE FOR PERFORMING A PARTIAL READ OPERATION AND A METHOD OF READING THE SAME

CROSS-REFERENCE TO RELATED APPLICATION

This U.S. non-provisional patent application claims priority under 35 U.S.C. § 119 to Korean Patent Application No. 10-2016-0159556, filed on Nov. 28, 2016, the disclosure of which is incorporated by reference herein in its entirety.

TECHNICAL FIELD

The inventive concept relates to semiconductor memory devices, and more particularly, to a nonvolatile memory device for performing a partial read operation.

DISCUSSION OF RELATED ART

A semiconductor memory device may be classified as a volatile memory device or a nonvolatile memory device. A volatile memory device is computer storage that only maintains its data while the device is powered. In other words, the volatile memory device loses its stored data when its power is interrupted. A nonvolatile memory device retains its stored data even after having been power cycled (e.g., turned off and back on). Thus, a nonvolatile memory device is used to store data in the absence of power. Examples of the nonvolatile memory device include a mask read only memory (MROM), a programmable ROM (PROM), an electrically programmable ROM (EPROM), an electrically erasable and programmable ROM (EEPROM), etc.

A nonvolatile memory device may read stored data in units of pages connected to a word line. A nonvolatile memory device may also divide individual pages into a plurality of parts to read the divided parts.

SUMMARY

Exemplary embodiments of the inventive concept provide a nonvolatile memory device. The nonvolatile memory device may include a first cell string including first memory cells and a first dummy cell that are stacked in a direction perpendicular to a substrate and connected to a selected string select line, a second cell string including second memory cells and a second dummy cell that are stacked in the direction perpendicular to the substrate and connected to the selected string select line, a page buffer circuit configured to select one of the first and second cell strings to read data in a read operation, and a control logic circuit configured to apply a first bit line voltage to a bit line connected to the selected one of the first and second cell strings and a second bit line voltage to a bit line connected to an unselected one of the first and second cell strings in the read operation. When the first cell string is selected, the control logic turns off the second dummy cell and when the second cell string is selected, the control logic turns off the first dummy cell. The second bit line voltage has a level lower than the first bit line voltage.

Exemplary embodiments of the inventive concept provide a method of reading a nonvolatile memory device, the nonvolatile memory device including a first cell string including first memory cells and a first dummy cell that are stacked in a direction perpendicular to a substrate and connected to a selected string select line, and a second cell string including second memory cells and a second dummy cell that are stacked in the direction perpendicular to the substrate and connected to the selected string select line. The method may include applying a first bit line voltage to a first bit line connected to the first cell string, applying a second bit line voltage to a second bit line connected to the second cell string, when the first cell string is selected, applying a first dummy word line voltage to a first dummy word line connected to the first dummy cell and applying a second dummy word line voltage to a second dummy word line connected to the second dummy cell, and sensing data stored in a selected memory cell of the first cell string. The first dummy cell is turned on and the second dummy cell is turned off, when the first cell string is selected.

Exemplary embodiments of the inventive concept provide a nonvolatile memory device including: a first cell string including first memory cells and a first dummy cell that are stacked in a direction perpendicular to a substrate, wherein the first cell string is connected to a selected bit line; a second cell string including second memory cells and a second dummy cell that are stacked in the direction perpendicular to the substrate, wherein the second cell string is connected to an unselected bit line; and a control logic circuit configured to apply a first bit line voltage to a bit line connected to the first cell string and a second bit line voltage to a bit line connected to the second cell string in a read operation, wherein the second bit line voltage is greater than a ground voltage and less than the first bit line voltage.

DETAILED DESCRIPTION OF THE EMBODIMENTS

Figure 1:
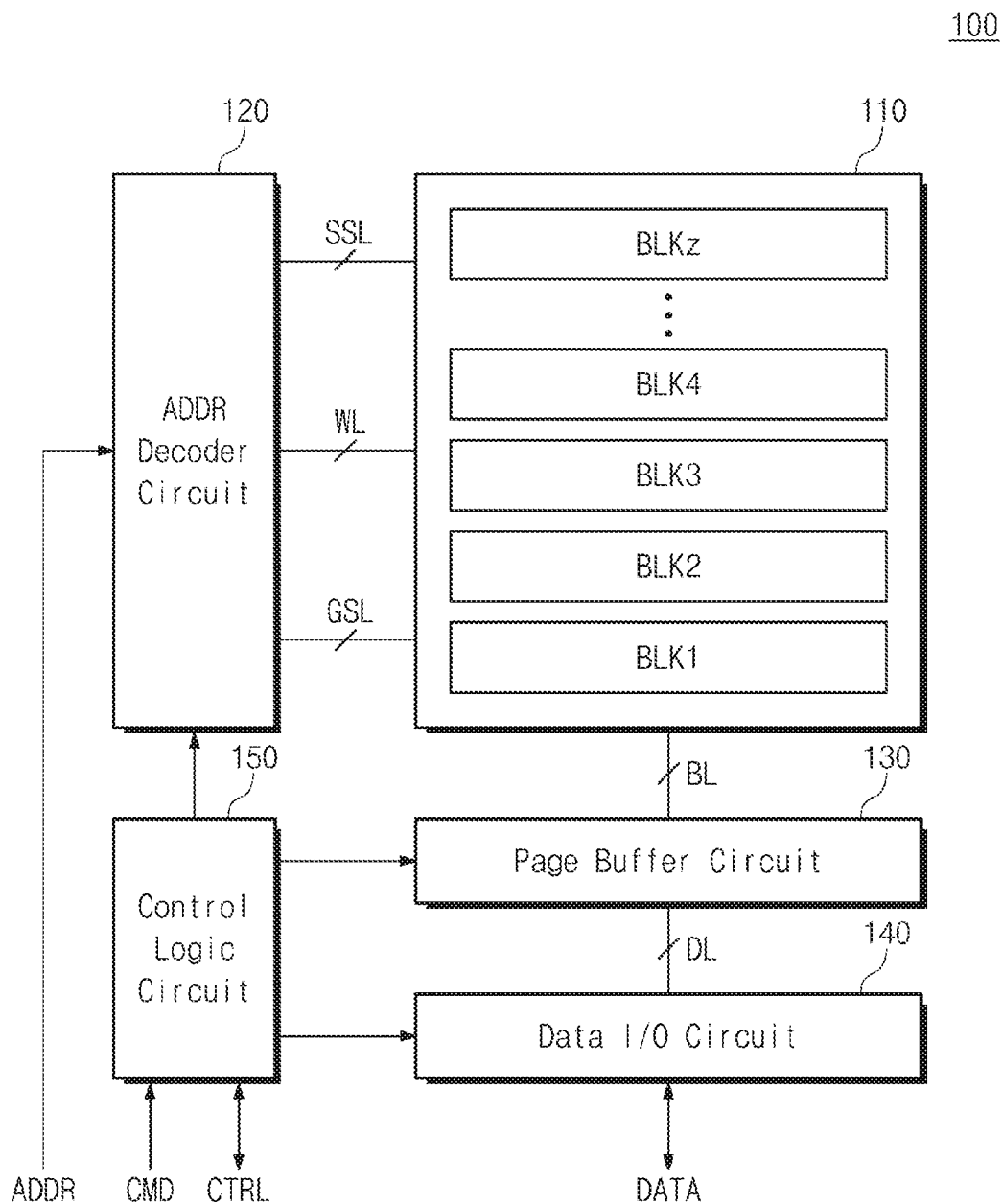
FIG. 1 is a block diagram illustrating a nonvolatile memory device according to exemplary embodiments of the inventive concept.

Below, exemplary embodiments of inventive concept will be described with reference to the attached drawings. Like reference numerals refer to like elements throughout this application.

FIG. 1 is a block diagram illustrating a nonvolatile memory device 100 according to exemplary embodiments of the inventive concept. Referring to FIG. 1, the nonvolatile memory device 100 may include a memory cell array 110, an address decoder circuit 120, a page buffer circuit 130, a data input/output circuit 140, and a control logic circuit 150.

The memory cell array 110 may include a plurality of memory blocks (BLK1 to BLKz). Each memory block may include a plurality of memory cells. Each memory block may be connected to the address decoder circuit 120 through at least one ground select line GSL, a plurality of word lines WL, and at least one string select line SSL. Each memory block may be connected to the page buffer circuit 130 through a plurality of bit lines BL. The plurality of memory blocks (BLK1 to BLKz) may be connected to the plurality of bit lines BL in common. The memory cells of the plurality of memory blocks (BLK1 to BLKz) may have the same structure as each other. Each of the plurality of memory blocks (BLK1 to BLKz) may be a unit of an erase operation. Memory cells of the memory cell array 110 may be erased in units of a memory block. Memory cells that belong to the same memory block may be erased at the same time. For example, each memory block may be divided into a plurality of sub blocks. Each of the plurality of sub blocks may be a unit of an erase operation.

The address decoder circuit 120 is connected to the memory cell array 110 through the plurality of ground select lines GSL, the plurality of word lines WL, and the plurality of string select lines SSL. The address decoder circuit 120 may operate under the control of the control logic circuit 150. The address decoder circuit 120 may receive an address ADDR from a memory controller. For example, an external memory controller. The address decoder circuit 120 may decode the received address ADDR and apply control voltages to the word lines WL according to the decoded address.

For example, in a program operation, the address decoder circuit 120 may apply a program voltage VPGM to a selected word line of a selected memory block indicated by the address ADDR and may apply a pass voltage VPASS to unselected word lines of the selected memory block. In a read operation, the address decoder circuit 120 may apply a read voltage VRD to the selected word line of the selected memory block indicated by the address ADDR and may apply an unselect read voltage VREAD to unselected word lines of the selected memory block. In an erase operation, the address decoder circuit 120 may apply erase voltages (e.g., a ground voltage or low voltages having similar levels to the ground voltage) to word lines of the selected memory block.

The page buffer circuit 130 may be connected to the memory cell array 110 through the plurality of bit lines BL. The page buffer circuit 130 may be connected to the data input/output circuit 140 through a plurality of data lines DL. The page buffer circuit 130 may operate under the control of the control logic circuit 150.

The page buffer circuit 130 may store data to be programmed in memory cells of the memory cell array 110 or data read from the memory cells of the memory cell array 110. In a program operation, the page buffer circuit 130 may store data to be programmed in the memory cells of the memory cell array 110. Based on the stored data, the page buffer circuit 130 may bias the plurality of bit lines BL. In a program operation, the page buffer circuit 130 may function as a write driver. In a read operation, the page buffer circuit 130 may sense voltages of the bit lines BL and may store a sensing result. In the read operation, the page buffer circuit 130 may function as a sense amplifier.

The data input/output circuit 140 may be connected to the page buffer circuit 130 through the plurality of data lines DL. The data input/output circuit 140 may exchange data with the memory controller. For example, the data input/output circuit 140 may temporarily store data DATA received from the memory controller. The data input/output circuit 140 may transmit the stored data to the page buffer circuit 130. The data input/output circuit 140 may temporarily store data DATA received from the page buffer circuit 130. The data input/output circuit 140 may transmit the stored data DATA to the memory controller. The data input/output circuit 140 may function as a buffer memory.

The control logic circuit 150 may receive a command CMD and a control signal CTRL from a memory controller. The control logic circuit 150 may decode the received command CMD and may control an overall operation of the nonvolatile memory device 100 according to the decoded command.

In a read operation, the control logic circuit 150 may generate and output a data strobe signal DQS from a read enable signal (/RE) among the received control signal CTRL. In a write operation, the control logic circuit 150 may generate and output a data strobe signal DQS from a write enable signal (/WE) among the received control signal CTRL.

In a read operation, the nonvolatile memory device 100 may selectively read a part of one page connected to a selected word line of a selected memory block. The page buffer circuit 130 may precharge selected bit lines among the bit lines BL. The page buffer circuit 130 may apply a ground voltage GND or a specific voltage to the remaining unselected bit lines among the bit lines BL to shield the selected bit lines.

Figure 2:
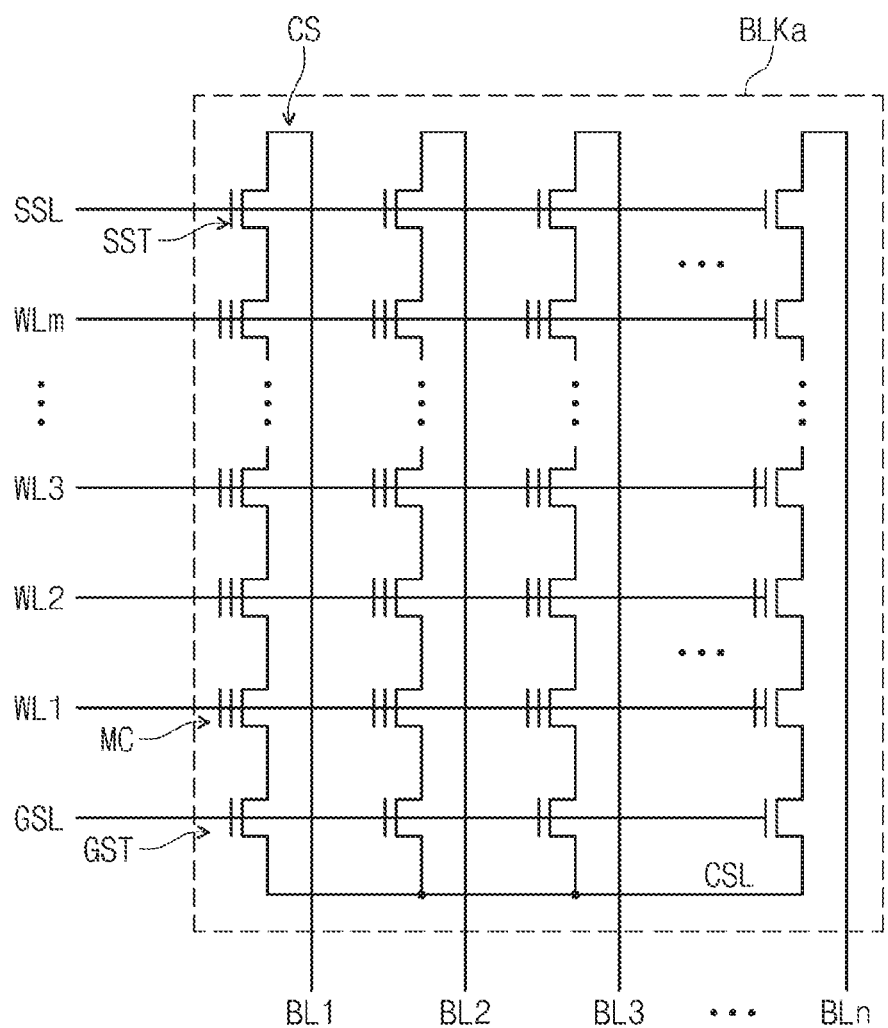
FIG. 2 is a view illustrating a memory block according to exemplary embodiments of the inventive concept.

FIG. 2 is a view illustrating a memory block BLKa according to exemplary embodiments of the inventive concept. Referring to FIG. 2, the memory block BLKa may have a two-dimensional plane structure and may include a plurality of cell strings CS. The plurality of cell strings CS may be connected to a plurality of bit lines (BL1 to BLn) respectively. Each cell string CS may include a ground selection transistor GST, memory cells MC, and a string selection transistor SST.

The ground selection transistor GST of each cell string CS may be connected between the memory cells MC and a common source line CSL. The ground selection transistors GST of the plurality of cell strings CS may be connected to the common source line CSL in common.

The string selection transistor SST of each cell string CS may be connected between the memory cells MC and the bit line BL. The string selection transistors SST of the plurality of cell strings CS may be connected to the bit lines (BL1 to BLn) respectively.

In each cell string CS, the plurality of memory cells MC may be provided between the ground selection transistor GST and the string selection transistor SST. In each cell string CS, the memory cells MC may be serially connected to one another. The memory cells MC may include a dummy memory cell. The dummy memory cell may not be used to store data. The dummy memory cell may be used for various purposes.

In the plurality of cell strings CS, memory cells MC located at the same distance from the common source line CSL may be connected to a word line in common. In other words, the fifth memory cell of a first cell string and the fifth memory cell of a second cell string may be connected to the same word line. The memory cells MC of the plurality of cell strings CS may be connected to a plurality of word lines (WL1 to WLm). The plurality of word lines (WL1 to WLm) may include a dummy word line connected to the dummy memory cell.

A program operation and a read operation of the memory cells MC may be performed units of word lines. Memory cells MC connected to one word line in common may be programmed or read at the same time. An erase operation of the memory cells MC may be performed in units of memory blocks. Memory cells MC of one memory block BLKa may be erased at the same time. For example, an erase operation of the memory cells MC may be performed in units of sub-blocks. One memory block BLKa may be divided into a plurality of sub-blocks and memory blocks MC of one sub-block may be erased at the same time.

Figure 3:
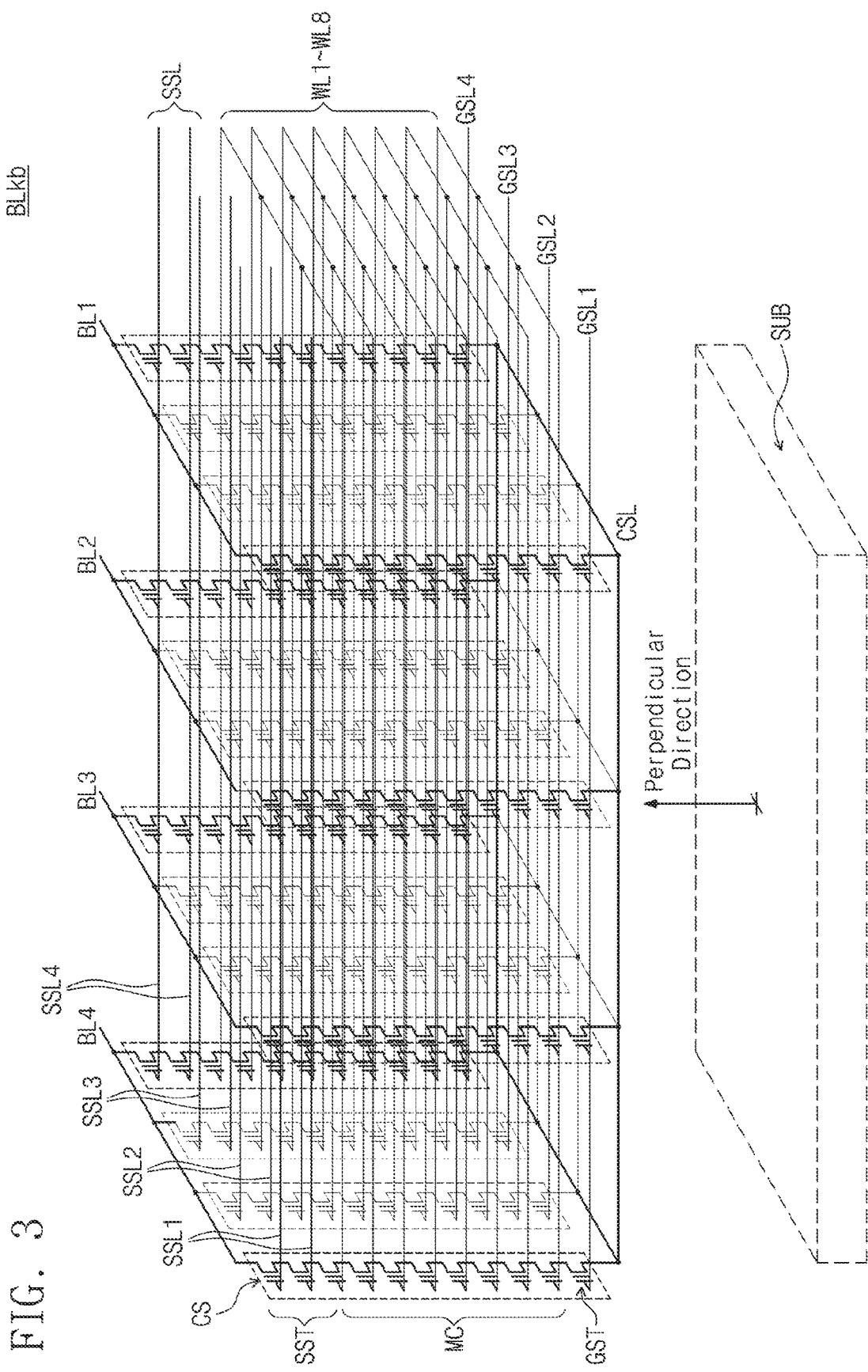
FIG. 3 is a view illustrating a memory block according to exemplary embodiments of the inventive concept.

FIG. 3 is a view illustrating a memory block BLKb according to exemplary embodiments of the inventive concept. Referring to FIG. 3, a plurality of cell strings CS may be arranged on a substrate SUB along a row direction and a column direction. The cell strings CS may be connected to a common source line CSL formed on the substrate SUB in common. In FIG. 3, to help understanding of a structure of the memory block BLKb, a location of the substrate SUB is shown. In FIG. 3, it is illustrated that the common source line CSL is directly connected to lower ends of the cell strings CS. However, the common source line CSL may simply be electrically connected to the lower ends of the cell strings CS. The common source line CLS is not limited to being physically located at the lower ends of the cell strings CS. In addition, although the cell strings CS are arranged in the form of a 4×4 matrix, the inventive concept is not limited thereto.

Cell strings CS of each row may be connected to a corresponding ground select line among first through fourth ground select lines (GSL1 to GSL4) or a corresponding string select line among first through fourth string select lines (SSL1 to SSL4). The first through fourth ground select lines (GSL1 to GSL4) may be connected to each other. Cell strings CS of each column may be connected to a corresponding bit line among first through fourth bit lines (BL1 to BL4). To prevent the view of FIG. 3 from being complicated, cell strings CS connected to the second and third ground select lines (GSL2, GSL3) or the second and third string select lines (SSL2, SSL3) are illustrated in a lighter shade of black.

Each of the cell strings CS may include at least one ground selection transistor GST connected to a corresponding ground select line, a plurality of memory cells MC connected to a plurality of word lines (WL1 to WL8) respectively, and at least one or two string selection transistor (s) SST connected to a corresponding string select line SSL. In each cell string CS, the ground selection transistor GST, the memory cells MC, and the string selection transistor SST may be serially connected along a direction perpendicular to the substrate SUB and may be sequentially stacked along the direction perpendicular to the substrate SUB. The memory cells MC may include a dummy memory cell. The dummy memory cell may not be used to store data. The dummy memory cell may be used for various purposes.

Memory cells of cell strings CS located at the same height (or order) from the substrate SUB or the ground selection transistor GST may be connected to the same word line in common. Memory cells of cell strings CS located at different heights (or orders) from the substrate SUB or the ground selection transistor GST may be connected to different word lines. For example, fifth memory cells of a first cell string and fourth memory cells of a second cell string may be connected to different word lines.

In an exemplary embodiment of the present inventive concept, a three dimensional (3D) memory array is provided. In other words, the memory cell array 110 may be implemented with a 3D memory array. The 3D memory array is monolithically formed in one or more physical levels of arrays of memory cells having an active area disposed above a silicon substrate and circuitry associated with the operation of those memory cells. The associated circuitry may be above or within such substrate. The term "monolithic" may mean that layers of each level of the array are directly deposited on the layers of each underlying level of the array.

In an exemplary embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one selection transistor located over memory cells. The at least one selection transistor may have the same structure as the memory cells and be formed monolithically together with the memory cells.

The following patent documents, which are incorporated by reference herein in their entireties, describe configurations for 3D memory arrays, in which a 3D memory array is configured as a plurality of levels, with word lines and/or bit lines shared between levels: U.S. Pat. Nos. 7,679,133; 8,553,466; 8,654,587; 8,559,235; and U.S. Pat. Pub. No. 2011/0233648.

Figure 4:
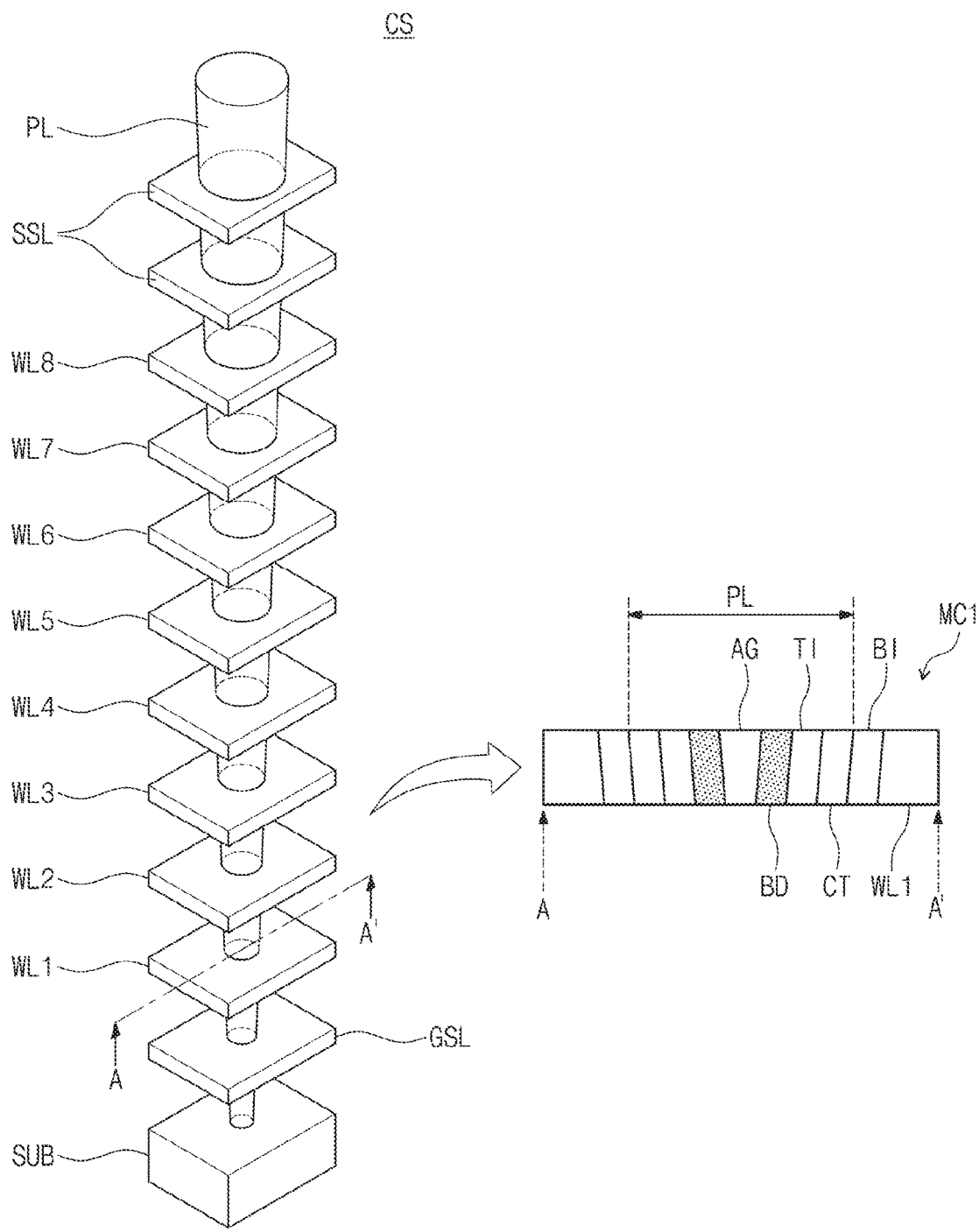
FIG. 4 is a view illustrating a structure of a cell string of the memory block of FIG. 3 according to exemplary embodiments of the inventive concept.

FIG. 4 is a view illustrating a structure of a cell string CS of the memory block BLKb of FIG. 3 according to an exemplary embodiment of the inventive concept. Referring to FIGS. 3 and 4, a pillar PL may be provided which extends in a direction perpendicular to the substrate SUB to contact the substrate SUB. A ground select line GSL, word lines (WL1 to WL8), and string select lines SSL may be formed from conductive materials (e.g., metal materials) parallel to the substrate SUB. The pillar PL may penetrate the ground select line GSL, the word lines (WL1 to WL8), and the string select lines SSL to contact the substrate SUB. The word lines (WL1 to WL8) may include a dummy word line that is not used to store data. The dummy word line may be used for other purposes.

In FIG. 4, a cross sectional view taken along a cutting-plane line (A-A') is illustrated. A cross sectional view of the first memory cell MC1 corresponding to the first word line WL1 may be illustrated. The pillar PL may include a cylindrical body BD. An air gap AG may be provided inside the body BD. The body BD may include p-type silicon and may be an area where a channel is formed. The pillar PL may further include a cylindrical tunnel insulating layer TI surrounding the body BD and a cylindrical charge trap layer CT surrounding the cylindrical tunnel insulating layer TI. A blocking insulating layer BI may be provided between the first word line WL1 and the pillar PL. The body BD, the tunnel insulating layer TI, the charge trap layer CT, the blocking insulating layer BI, and the first word line WL1 may be a charge trap transistor formed in a direction perpendicular to the substrate SUB or a top surface of the substrate SUB. The string selection transistors SST, the ground selection transistor GST, and other memory cells may have the same general structure as the first memory cell MC1. For example, one of the string selection transistors SST may have a wider pillar body compared to the ground selection transistor GST.

In a manufacturing process of the cell string CS, as a distance from the substrate SUB is reduced, a width of the pillar PL or a cross section area parallel to a top surface of the substrate SUB may be small. In other words, the closer the pillar PL is to the substrate SUB the smaller its width and the farther the pillar PL is from the substrate SUB the larger its width. Thus, when the same voltage is applied to bodies of the ground selection transistor GST, the memory cells MC, and the string selection transistors SST and the same voltage is applied to the ground select line GSL, the word lines (WL1 to WL8) and the string select lines SSL, an electric field formed at a memory cell adjacent to the substrate SUB or at the ground selection transistor GST is greater than an electric field formed at a memory cell far away from the substrate SUB or at the string selection transistor SST. This difference in electric field strength may lead a read disturbance that occurs while a read operation is performed.

In a read operation, a select read voltage may be applied to a word line connected to memory cells selected as a read target. The select read voltage has a level within a threshold voltage range of memory cells. Since the strength of an electric field that occurs in the selected memory cells is small, a read disturbance may not occur or may occur very little. In a read operation, an unselect read voltage may be applied to word lines connected to memory cells not selected as a read target. The unselect read voltage has a level higher than the threshold voltage range of the memory cells. Since the strength of an electric field that occurs in the unselected memory cells is relatively large, a read disturbance may occur in the unselected memory cells.

Figure 5:
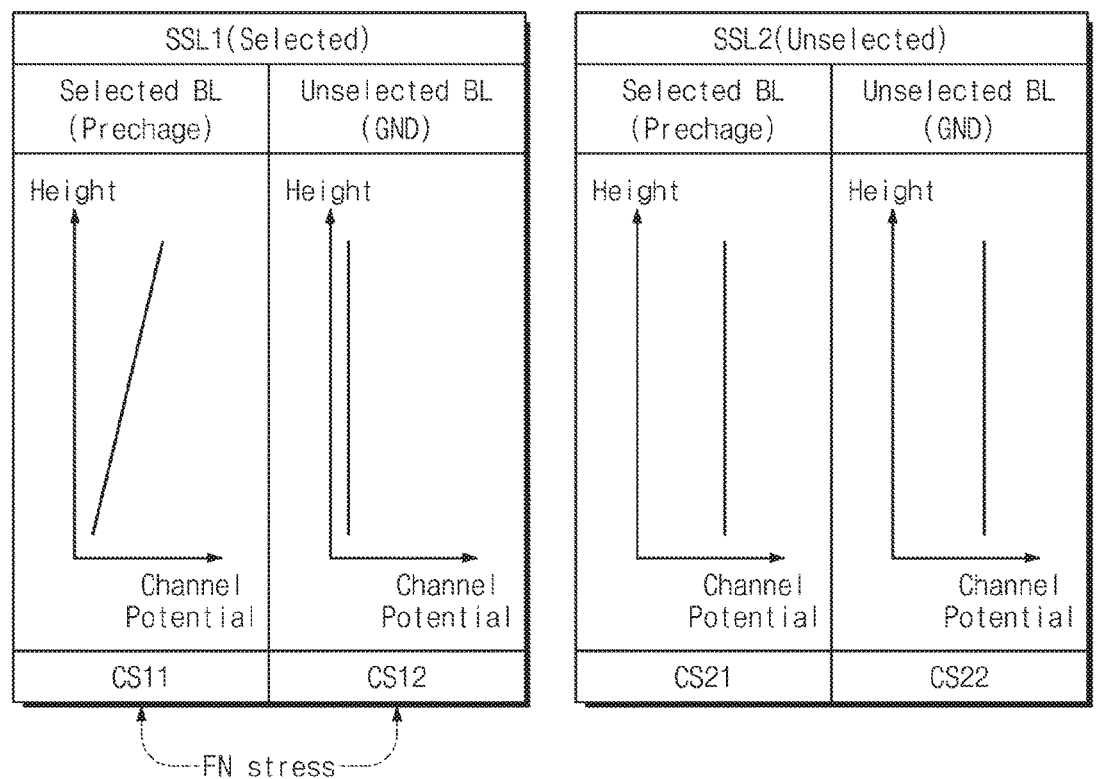
FIG. 5 is a view illustrating a channel potential of cell strings of a nonvolatile memory device in a read operation.

FIG. 5 is a view illustrating a channel potential of cell strings of a nonvolatile memory device in a read operation. Referring to FIG. 5, in a read operation, the nonvolatile memory device 100 may select bit lines to read data stored in a memory cell. In a read operation, the nonvolatile memory device 100 may apply a select read voltage VRD to a selected word line of a selected memory block indicated by a received address ADDR and may apply an unselect read voltage VREAD to unselected word lines of the selected memory block. A precharge voltage may be applied to a selected bit line. A ground voltage GND may be applied to an unselected bit line to prevent coupling between bit lines.

For example, in the case of an unselected second string select line SSL2, there is no difference in channel potentials of a cell string CS21 and a cell string CS22 regardless of a voltage applied to a bit line. This is because the unselected string select line SSL2 is floated.

However, in the case of a selected first string select line SSL1, a cell string CS11 connected to a selected bit line may have a channel potential due to a precharge voltage. A cell string CS12 connected to an unselected bit line may have a channel potential due to the ground voltage GND. Thus, because of the channel potential difference, memory cells connected to a word line selected in the cell string CS11 and the cell string CS12 may be under a Fowler Nordheim (FN) stress. A characteristic of these memory cells may be deteriorated due to the FN stress.

Figure 6:
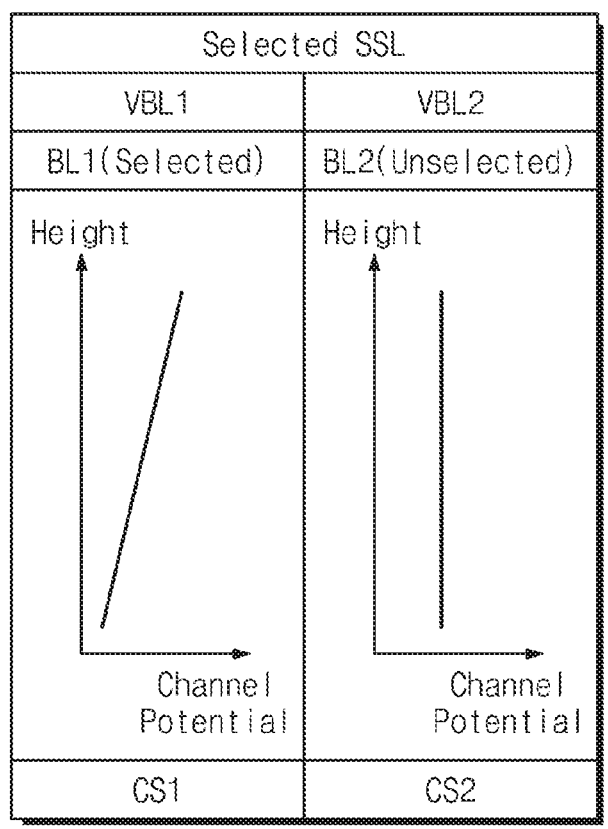
FIG. 6 is a view illustrating a channel potential of cell strings connected to a selected string select line in a read operation according to exemplary embodiments of the inventive concept.

FIG. 6 is a view illustrating a channel potential of cell strings connected to a selected string select line in a read operation according to exemplary embodiments of the inventive concept. Referring to FIG. 6, in a read operation, the nonvolatile memory device 100 may select bit lines to read data stored in a memory cell. In a read operation, the nonvolatile memory device 100 may apply a select read voltage VRD to a selected word line of a selected memory block indicated by a received address ADDR and may apply an unselect read voltage VREAD to unselected word lines of the selected memory block. A first bit line voltage VBL1 may be applied to a selected bit line as a precharge voltage. A second bit line voltage VBL2 may be applied to unselected bit lines to prevent coupling between bit lines. The second bit line voltage VBL2 may have a level between the first bit line voltage VBL1 and a ground voltage GND. In other words, the first bit line voltage VBL1 is greater than the second bit line voltage VBL2.

For example, a first cell string CS1 connected to a selected first bit line BL1 may have a channel potential due to the first bit line voltage VBL1. A second cell string CS2 connected to an unselected second bit line BL2 may have a channel potential due to the second bit line voltage VBL2. The channel potential due to the second bit line voltage VBL2 is higher than a channel potential due to the ground voltage GND. Thus, a FN stress between the first cell string CS1 and the second cell string CS2 in FIG. 6 is reduced more than the FN stress between the first cell string CS11 and the second cell string CS12 of FIG. 5. Therefore, a deterioration of characteristics of the first cell string CS1 and the second cell string CS2 may be reduced by employing the method of FIG. 6.

Figure 7:
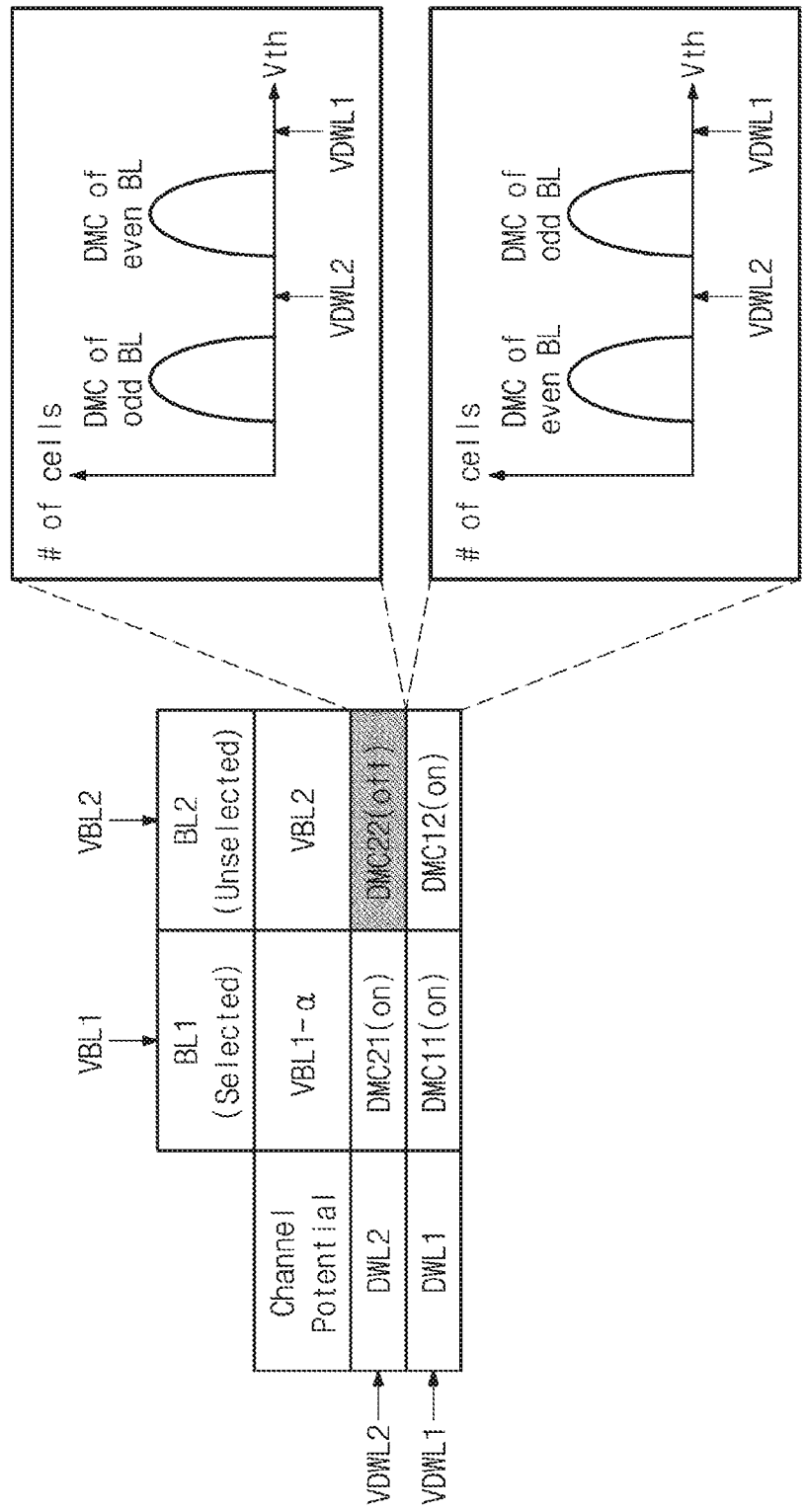
FIGS. 7 and 8 are views illustrating a read method for forming a channel potential of FIG. 6 according to exemplary embodiments of the inventive concept.
Figure 8:
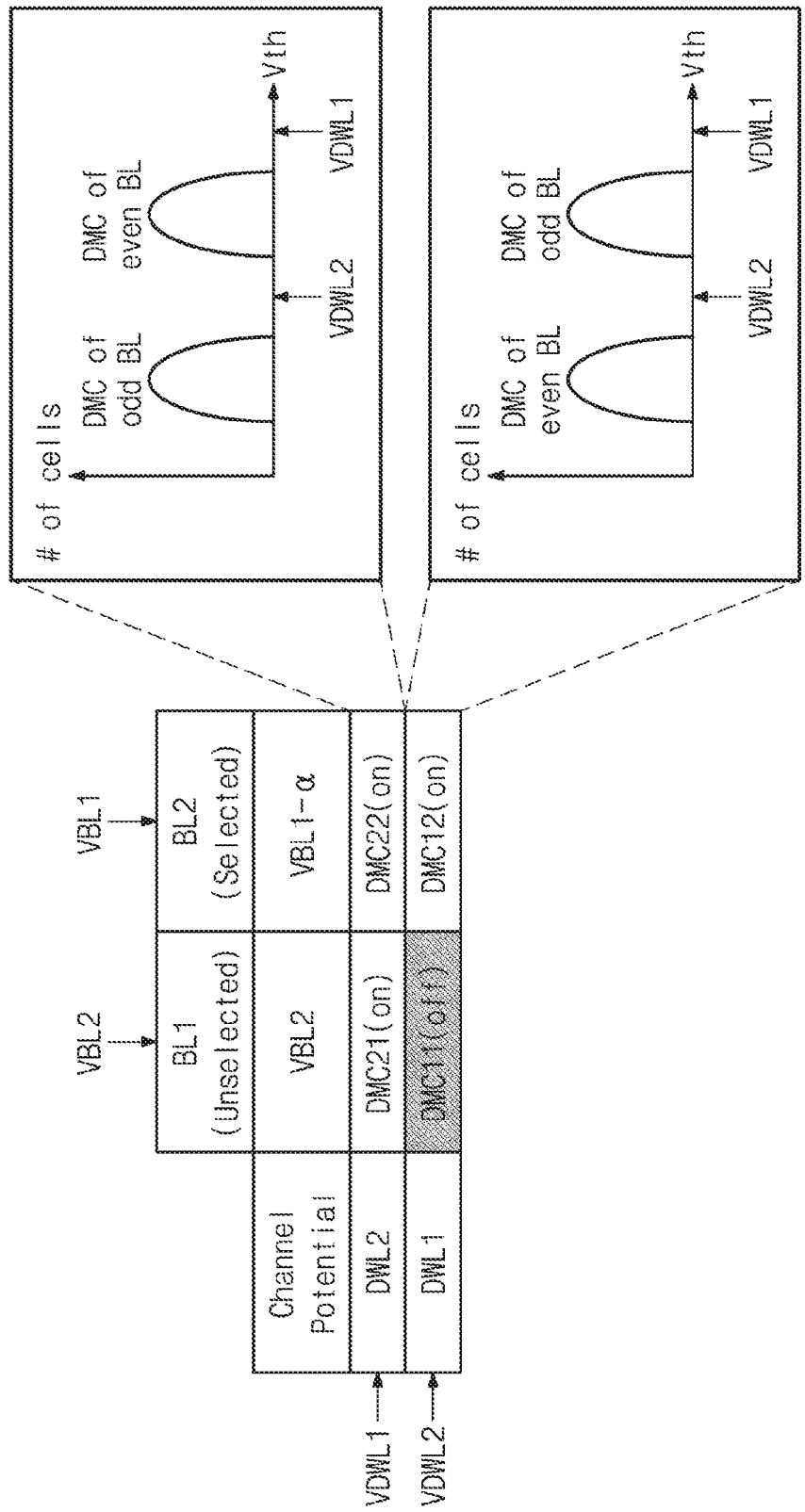

FIGS. 7 and 8 are views illustrating a read method for forming a channel potential of FIG. 6 according to an exemplary embodiment of the inventive concept. FIGS. 7 and 8 illustrate a state of cell strings connected to a selected string select line of the nonvolatile memory device 100 in a read operation. FIG. 7 illustrates a case where a first bit line BL1 is selected. In other words, FIG. 7 illustrates a case where odd bit lines are selected. FIG. 8 illustrates a case where a second bit line BL2 is selected. In other words, FIG. 8 illustrates a case where even bit lines are selected.

Referring to FIGS. 7 and 8, the nonvolatile memory device 100 may include dummy word lines (DWL1, DWL2). Dummy memory cell DMC11 may be connected to the first dummy word line DWL1 and the first bit line BL1. Dummy memory cell DMC12 may be connected to the first dummy word line DWL1 and the second bit line BL2. Dummy memory cell DMC21 may be connected to the second dummy word line DWL2 and the first bit line BL1. Dummy memory cell DMC22 may be connected to the second dummy word line DWL2 and the second bit line BL2.

The dummy memory cells connected to the dummy word lines (DWL1, DWL2) may be programmed differently from each other. For example, memory cells connected to an even bit line among dummy memory cells connected to the first dummy word line DWL1 (e.g., DMC of even BL) may be programmed to have a threshold voltage lower than a second dummy word line voltage VDWL2. Memory cells connected to an odd bit line among dummy memory cells connected to the first dummy word line DWL1 (e.g., DMC of odd BL) may be programmed to have a threshold voltage between a first dummy word line voltage VDWL1 and the second dummy word line voltage VDWL2. Memory cells connected to an odd bit line among dummy memory cells connected to the second dummy word line DWL2 (e.g., DMC of odd BL) may be programmed to have a threshold voltage lower than the second dummy word line voltage VDWL2. Memory cells connected to an even bit line among dummy memory cells connected to the second dummy word line DWL2 (e.g., DMC of even BL) may be programmed to have a threshold voltage between the first and second dummy word line voltages (VDWL1, VDWL2).

In FIG. 7, the first bit line BL1 is a selected bit line and the second bit line BL2 is an unselected bit line adjacent to the first bit line BL1. A first bit line voltage VBL1 may be applied to the selected first bit line BL1 as a precharge voltage. A second bit line voltage VBL2 may be applied to the unselected second bit line BL2 to prevent coupling between bit lines. The second bit line voltage VBL2 may have a level between the first bit line voltage VBL1 and a ground voltage GND.

To prevent a current from flowing through a channel to which the second bit line BL2 is connected and to maintain a channel potential at the second bit line voltage VBL2, the dummy memory cell DMC22 may be turned off. For example, the nonvolatile memory device 100 may apply the first dummy word line voltage VDWL1 to the first dummy word line DWL1. The nonvolatile memory device 100 may apply the second dummy word line voltage VDWL2 to the second dummy word line DWL2. That way, the dummy memory cell DMC22 connected to the second dummy word line DWL2 may be turned off.

In other words, dummy memory cells connected to an even bit line among dummy memory cells connected to the second dummy word line DWL2 may be turned off. Thus, in a read operation, a channel connected to the unselected second bit line BL2 may have a channel potential corresponding to the second bit line voltage VBL2. In this case, a channel connected to the selected first bit line BL1 may have a channel potential corresponding to a difference between the first bit line voltage VBL1 and a characteristic value ($\alpha$) according to a selected word line. Consequently, the nonvolatile memory device 100 may reduce a read disturbance caused by a FN stress in the read operation.

In FIG. 8, the second bit line BL2 is a selected bit line and the first bit line BL1 is an unselected bit line adjacent to the second bit line BL2. The first bit line voltage VBL1 may be applied to the selected second bit line BL2 as a precharge voltage. The second bit line voltage VBL2 may be applied to the unselected first bit line BL1 to prevent coupling between bit lines. The second bit line voltage VBL2 may have a level between the first bit line voltage VBL1 and a ground voltage GND.

To prevent a current from flowing through a channel to which the first bit line BL1 is connected and to maintain a channel potential at the second bit line voltage VBL2, the dummy memory cell DMC11 may be turned off. For example, the nonvolatile memory device 100 may apply the second dummy word line voltage VDWL2 to the first dummy word line DWL1. The nonvolatile memory device 100 may apply the first dummy word line voltage VDWL1 to the second dummy word line DWL2. That way, the dummy memory cell DMC11 connected to the first dummy word line DWL1 may be turned off.

In other words, dummy memory cells connected to an odd bit line among dummy memory cells connected to the first dummy word line DWL1 may be turned off. Thus, in a read operation, a channel connected to the unselected first bit line BL1 may have a channel potential corresponding to the second bit line voltage VBL2. In this case, a channel connected to the selected second bit line BL2 may have a channel potential corresponding to a difference between the first bit line voltage VBL1 and a characteristic value ($\alpha$) according to a selected word line. Consequently, the nonvolatile memory device 100 may reduce a read disturbance caused by a FN stress in the read operation.

Figure 9:
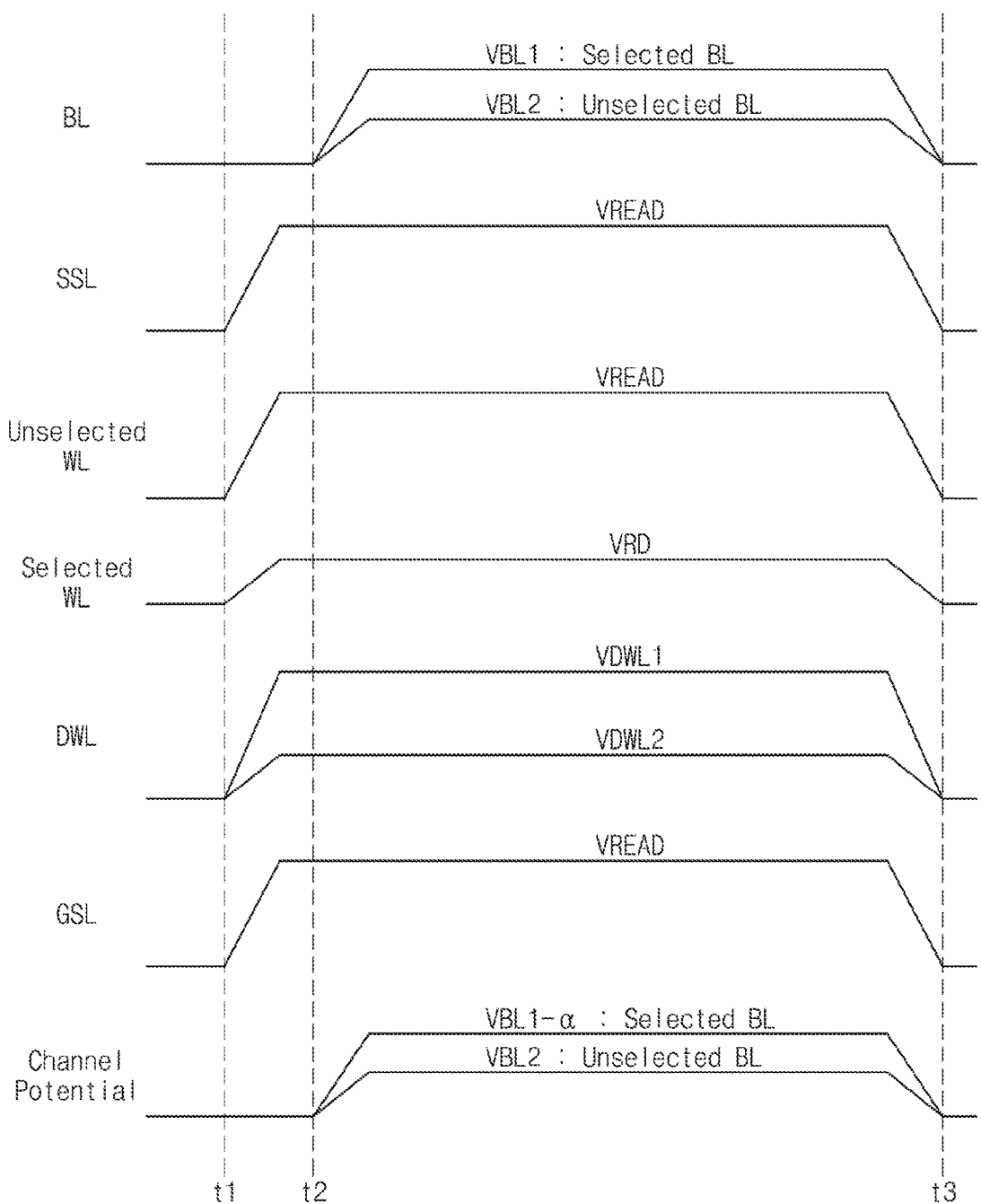
FIG. 9 is a timing diagram illustrating voltages applied in a read operation according to exemplary embodiments of the inventive concept.

FIG. 9 is a timing diagram illustrating voltages applied in a read operation according to exemplary embodiments of the inventive concept. Referring to FIG. 9, the nonvolatile memory device 100 may select a string select line of a selected memory block based on a received address ADDR in a read operation. A bias state associated with the selected string select line is described hereinafter.

At time t1, the nonvolatile memory device 100 may apply an unselect read voltage VREAD to a string select line SSL and a ground select line GSL. For example, the unselect read voltage VREAD is a voltage that can turn on memory cells connected to the string select line SSL and the ground select line GSL. The nonvolatile memory device 100 may apply a select read voltage VRD to a selected word line (Selected WL) and may apply the unselect read voltage VREAD to an unselected word line (Unselected WL). For example, the unselect read voltage VREAD is a voltage that can turn on memory cells connected to unselected word lines. The select read voltage VRD is a voltage for reading data stored in memory cells connected to the selected word line. In the case where the memory cells are multi-level cells, a plurality of select read voltages VRD may be used.

The nonvolatile memory device 100 may apply a first or second dummy word line voltage (VDWL1, VDWL2) to dummy word lines DWL depending on a location of a selected bit line. For example, as described in FIGS. 7 and 8, the nonvolatile memory device 100 may apply different dummy word line voltages to first and second dummy word lines (DWL1, DWL2) depending on whether the selected bit line is an odd bit line or an even bit line.

At time t2, the nonvolatile memory device 100 may apply a first bit line voltage VBL1 to the selected bit line to precharge the selected bit line and may apply a second bit line voltage VBL2 to an unselected bit line to form a channel potential of a channel connected to the unselected bit line. The channel potential of the channel connected to the unselected bit line is VBL2 and the channel potential of the channel connected to the selected bit line is VBL1-$\alpha$.

Figure 10:
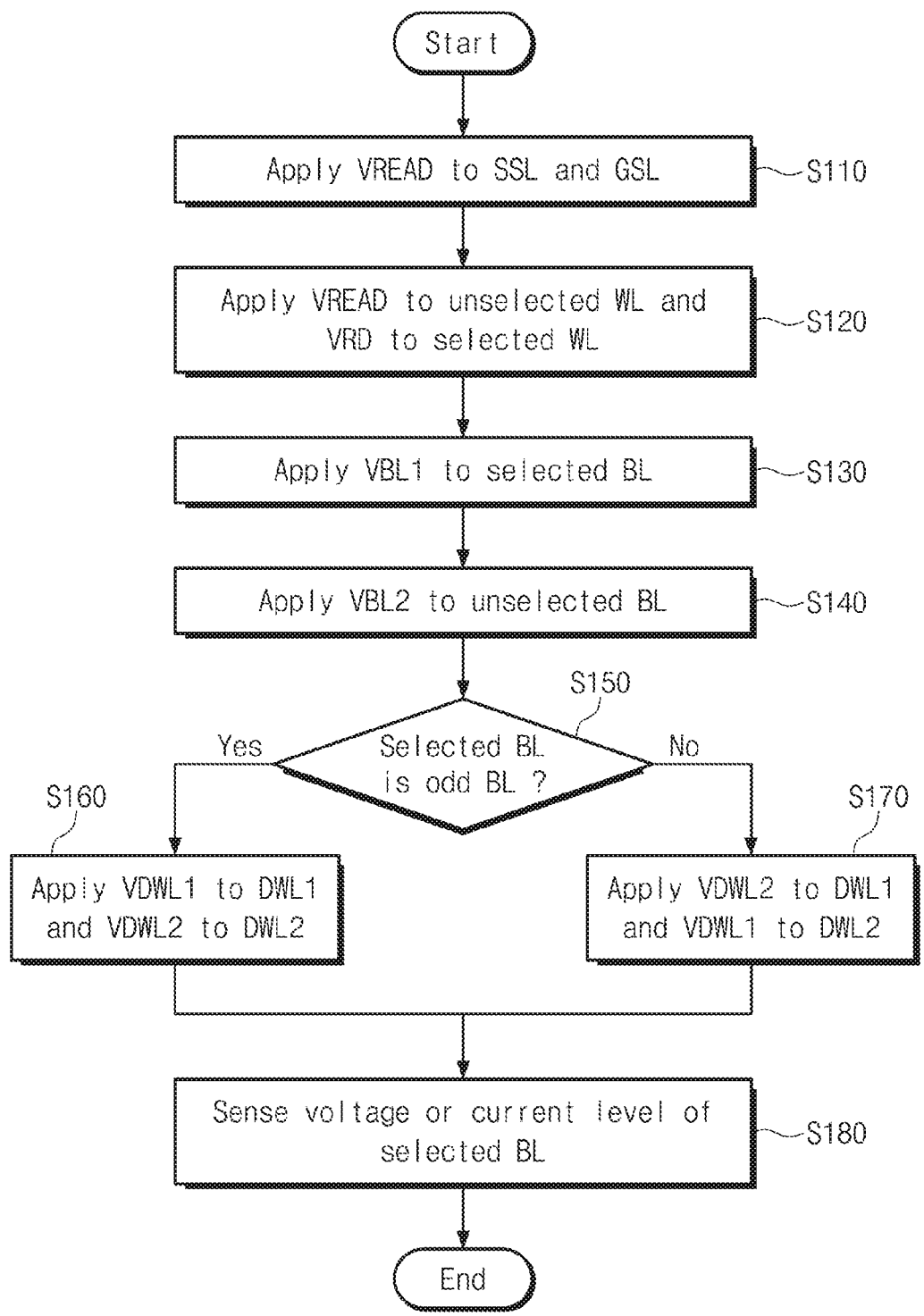
FIG. 10 is a flowchart illustrating a read operation according to exemplary embodiments of the inventive concept.

FIG. 10 is a flowchart illustrating a read operation according to exemplary embodiments of the inventive concept. Referring to FIG. 10, the nonvolatile memory device 100 may selectively read a part of one page from a selected memory block.

In an operation S110, the nonvolatile memory device 100 may apply an unselect read voltage VREAD to a string select line SSL and a ground select line GSL. For example, the unselect read voltage VREAD is a voltage that can turn on memory cells connected to the string select line SSL and the ground select line GSL.

In an operation S120, the nonvolatile memory device 100 may apply a select read voltage VRD to a selected word line and may apply the unselect read voltage VREAD to an unselected word line. For example, the unselect read voltage VREAD is a voltage that can turn on memory cells connected to unselected word lines. The select read voltage VRD is a voltage for reading data stored in memory cells connected to the selected word line.

In an operation S130, the nonvolatile memory device 100 may apply a first bit line voltage VBL1 to a selected bit line. For example, the nonvolatile memory device 100 may select one of an odd bit line and an even bit line. The first bit line voltage VBL1 is a precharge voltage for reading data stored in memory cell.

In an operation S140, the nonvolatile memory device 100 may apply a second bit line voltage VBL2 to an unselected bit line. For example, in the case where the odd bit line is selected in the operation S130, the even bit line becomes the unselected bit line. In the case where the even bit line is selected in the operation S130, the odd bit line becomes the unselected bit line. Thus, the unselected bit line is a bit line adjacent to the selected bit line.

In an operation S150, the nonvolatile memory device 100 may determine whether the selected bit line is an odd bit line. In an operation S160, in the case where the selected bit line is an odd bit line, the nonvolatile memory device 100 may apply a first dummy word line voltage VDWL1 to a first dummy word line DWL1 and may apply a second dummy word line voltage VDWL2 to a second dummy word line DWL2. For example, when the first dummy word line voltage VDWL1 is applied to the first dummy word line DWL1, dummy memory cells connected to the first dummy word line DWL1 may be all turned on. When the second dummy word line voltage VDWL2 is applied to the second dummy word line DWL2, dummy memory cells connected to even bit lines among dummy memory cells connected to the second dummy word line DWL2 may be turned off. In an operation S170, in the case where the selected bit line is an even bit line, the nonvolatile memory device 100 may apply the second dummy word line voltage VDWL2 to the first dummy word line DWL1 and may apply the first dummy word line voltage VDWL1 to the second dummy word line DWL2. For example, when the first dummy word line voltage VDWL1 is applied to the second dummy word line DWL2, dummy memory cells connected to the second dummy word line DWL2 may be all turned on. When the second dummy word line voltage VDWL2 is applied to the first dummy word line DWL1, dummy memory cells connected to odd bit lines among dummy memory cells connected to the first dummy word line DWL1 may be turned off.

In an operation S180, the nonvolatile memory device 100 may measure a voltage or current level of the selected bit line. In other words, the nonvolatile memory device 100 may read data of a memory cell connected to the selected bit line and the selected word line. A cell string connected to the selected bit line has a channel potential corresponding to the first bit line voltage VBL1 and a cell string connected to the unselected bit line has a channel potential corresponding to the second bit line voltage VBL2. Thus, the nonvolatile memory device 100 may reduce a read disturbance caused by a FN stress in a read operation by controlling the second bit line voltage VBL2.

Figure 11:
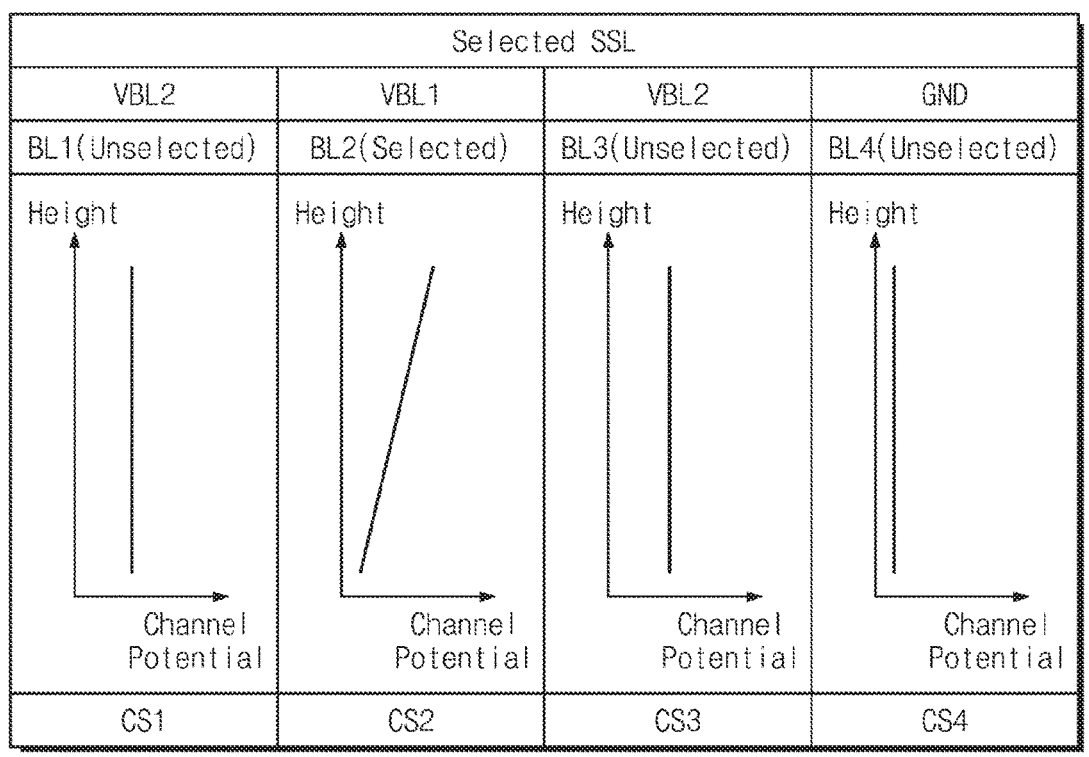
FIG. 11 is a view illustrating a channel potential of cell strings connected to a selected string select line in a read operation according to exemplary embodiments of the inventive concept.

FIG. 11 is a view illustrating a channel potential of cell strings connected to a selected string select line in a read operation according to exemplary embodiments of the inventive concept. Referring to FIG. 11, the nonvolatile memory device 100 may select bit lines to read data stored in a memory cell in a read operation. In the read operation, the nonvolatile memory device 100 may apply a select read voltage VRD to a selected word line (e.g., BL2) of a selected memory block indicated by a received address ADDR and may apply an unselect read voltage VREAD to unselected word lines (e.g., BL1, BL3 and BL4) of the selected memory block. A first bit line voltage VBL1 may be applied to the selected bit line (e.g., BL2) as a precharge voltage. A second bit line voltage VBL2 may be applied to an unselected bit line (e.g., BL1 and/or BL3) adjacent to the selected bit line among the unselected bit lines to prevent coupling between bit lines. A ground voltage GND may be applied to the remaining unselected bit lines (e.g., BL4). The second bit line voltage VBL2 may have a level between the first bit line voltage VBL1 and the ground voltage GND.

In FIG. 11, a second cell string CS2 connected to a selected second bit line BL2 may have a channel potential caused by the first bit line voltage VBL1. First and third cell strings (CS1, CS3) connected to unselected first and third bit lines (BL1, BL3) adjacent to the selected second bit line BL2 may have a channel potential caused by the second bit line voltage VBL2. A fourth cell string CS4 connected to the fourth bit line BL4 may have a channel potential caused by the ground voltage GND. The channel potential caused by the second bit line voltage VBL2 is higher than the channel potential caused by the ground voltage GND. Thus, the FN stress between the second cell string CS2 and the first cell string CS1 or between the second cell string CS2 and the third cell string CS3 is reduced more than the FN stress between the cell strings (CS11, CS12) of FIG. 5. Accordingly, characteristic deterioration of memory cells included in the first and third cell strings (CS1, CS3) may be reduced. The FN stress between the third cell string CS3 and the fourth cell string CS4 is also reduced.

Figure 12:
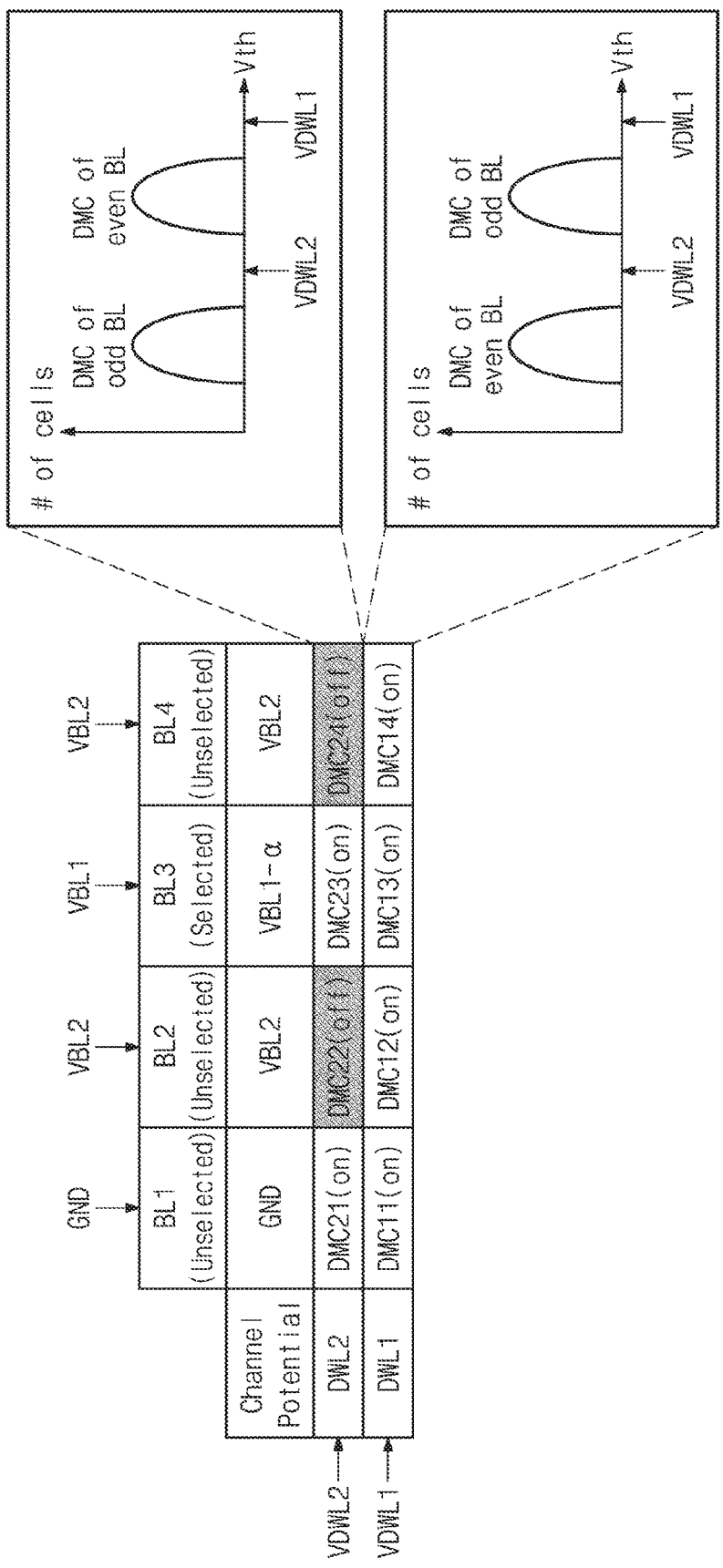
FIGS. 12 and 13 are views illustrating a read method for forming a channel potential of FIG. 11 according to exemplary embodiments of the inventive concept.
Figure 13:
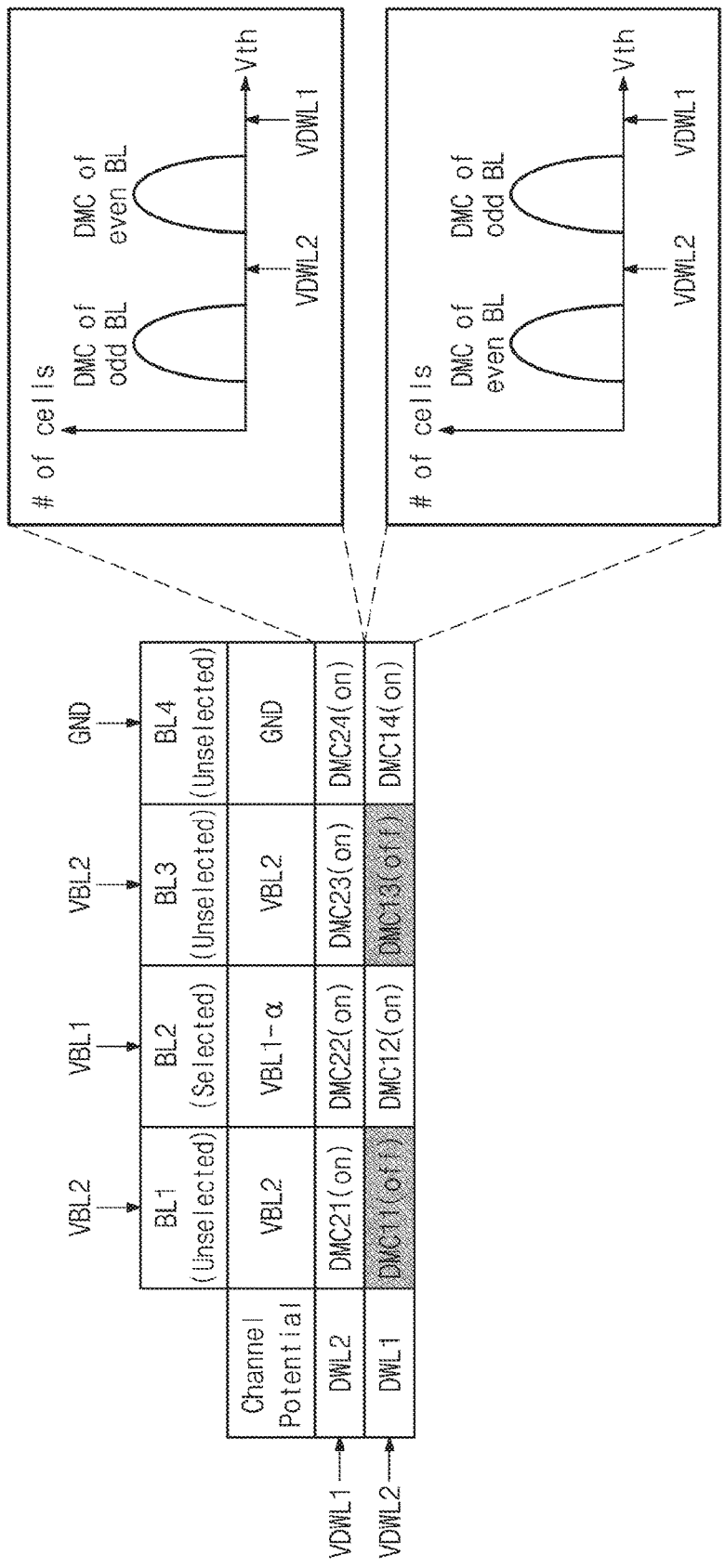

FIGS. 12 and 13 are views illustrating a read method for forming a channel potential of FIG. 11 according to exemplary embodiments of the inventive concept. FIGS. 12 and 13 illustrate a state of cell strings connected to a selected string select line of the nonvolatile memory device 100 in a read operation. FIG. 12 illustrates a case where a third bit line BL3 is selected. Here, four bit lines may form a group. However, a group of bit lines is not limited thereto. For example, more or less than four bit lines may form a group. FIG. 13 illustrates a case where a second bit line BL2 is selected.

Referring to FIGS. 12 and 13, the nonvolatile memory device 100 may include dummy word lines (DWL1, DWL2). A dummy memory cell DMC11 may be connected to the first dummy word line DWL1 and a first bit line BL1. A dummy memory cell DMC12 may be connected to the first dummy word line DWL1 and a second bit line BL2. A dummy memory cell DMC13 may be connected to the first dummy word line DWL1 and a third bit line BL3. A dummy memory cell DMC14 may be connected to the first dummy word line DWL1 and a fourth bit line BL4. A dummy memory cell DMC21 may be connected to the second dummy word line DWL2 and the first bit line BL1. A dummy memory cell DMC22 may be connected to the second dummy word line DWL2 and the second bit line BL2. A dummy memory cell DMC23 may be connected to the second dummy word line DWL2 and the third bit line BL3. A dummy memory cell DMC24 may be connected to the second dummy word line DWL2 and the fourth bit line BL4.

Dummy memory cells connected to the dummy word lines (DWL1, DWL2) may be programmed differently than each other. For example, a memory cell connected to an even bit line among memory cells connected to the first dummy word line DWL1 may have a threshold voltage lower than a second dummy word line voltage VDWL2. A memory cell connected to an odd bit line among memory cells connected to the first dummy word line DWL1 may have a threshold voltage between a first dummy word line voltage VDWL1 and the second dummy word line voltage VDWL2. A memory cell connected to an odd bit line among memory cells connected to the second dummy word line DWL2 may have a threshold voltage lower than the second dummy word line voltage VDWL2. A memory cell connected to an even bit line among memory cells connected to the second dummy word line DWL2 may have a threshold voltage between the first dummy word line voltage VDWL1 and the second dummy word line voltage VDWL2.

However, the program states of the dummy memory cells are not limited thereto. For example, the program states of the dummy memory cells in FIGS. 12 and 13 are merely exemplary and the dummy memory cells may be programmed to be individually turned on or off depending on a voltage applied to the dummy word lines. The number of dummy word lines is not limited to the number of dummy word lines shown in the drawings. For example, the nonvolatile memory device 100 may include one or more dummy word lines and may apply various combinations of dummy word line voltages. A location of the dummy memory cells is not limited to the locations of the dummy memory cells shown in the drawings. For example, the dummy memory cells may be located between a main memory cell and a ground selection transistor. The dummy memory cells may be located between a main memory cell and a string selection transistor. The dummy memory cells may be located between main memory cells.

In FIG. 12, the third bit line BL3 is a selected bit line and the second and fourth bit lines (BL2, BL4) are unselected bit lines adjacent to the third bit line BL3. The first bit line BL1 is an unselected bit line not adjacent to the third bit line BL3. A first bit line voltage VBL1 may be applied to the selected third bit line BL3 as a precharge voltage. A second bit line voltage VBL2 may be applied to the unselected second and fourth bit lines (BL2, BL4) to prevent coupling between bit lines. A ground voltage GND may be applied to the unselected first bit line BL1 to shield bit lines adjacent to the first bit line BL1.

To prevent a current from flowing through a channel to which the second and fourth bit lines (BL2, BL4) are connected and to maintain a channel potential at the second bit line voltage VBL2, the dummy memory cells (DMC22, DMC24) may be turned off, as shown in FIG. 12. For example, the nonvolatile memory device 100 may apply the first dummy word line voltage VDWL1 to the first dummy word line DWL1. The nonvolatile memory device 100 may apply the second dummy word line voltage VDWL2 to the second dummy word line DWL2. That way, the dummy memory cells (DMC22, DMC24) connected to the second dummy word line DWL2 may be turned off. In other words, dummy memory cells connected to an even bit line among dummy memory cells connected to the second dummy word line DWL2 may be turned off. Thus, in a read operation, channels connected to the unselected second and fourth bit lines (BL2, BL4) may have a channel potential corresponding to the second bit line voltage VBL2. In this case, a channel connected to the selected third bit line BL3 may have a channel potential corresponding to a difference between the first bit line voltage VBL1 and a characteristic value ($\alpha$) according to a selected word line. Consequently, the nonvolatile memory device 100 may reduce a read disturbance by a FN stress in the read operation.

In FIG. 13, the second bit line BL2 is a selected bit line and the first and third bit lines (BL1, BL3) are unselected bit lines adjacent to the second bit line BL2. The fourth bit line BL4 is an unselected bit line not adjacent to the second bit line BL2. A first bit line voltage VBL1 may be applied to the selected second bit line BL2 as a precharge voltage. A second bit line voltage VBL2 may be applied to the unselected first and third bit lines (BL1, BL3) to prevent coupling between bit lines. A ground voltage GND may be applied to the unselected fourth bit line BL4 to shield bit lines adjacent to the fourth bit line BL4.

To prevent a current from flowing through a channel to which the first and third bit lines (BL1, BL3) are connected and to maintain a channel potential at the second bit line voltage VBL2, the dummy memory cells (DMC11, DMC13) may be turned off, as shown in FIG. 13. For example, the nonvolatile memory device 100 may apply the first dummy word line voltage VDWL1 to the second dummy word line DWL2. The nonvolatile memory device 100 may apply the second dummy word line voltage VDWL2 to the first dummy word line DWL1. That way, the dummy memory cells (DMC11, DMC13) connected to the first dummy word line DWL1 may be turned off. In other words, dummy memory cells connected to an odd bit line among dummy memory cells connected to the first dummy word line DWL1 may be turned off. Thus, in a read operation, channels connected to the unselected first and third bit lines (BL1, BL3) may have a channel potential corresponding to the second bit line voltage VBL2. In this case, a channel connected to the selected second bit line BL2 may have a channel potential corresponding to a difference between the first bit line voltage VBL1 and a characteristic value ($\alpha$) according to a selected word line. Consequently, the nonvolatile memory device 100 may reduce a read disturbance by a FN stress in the read operation.

Figure 14:
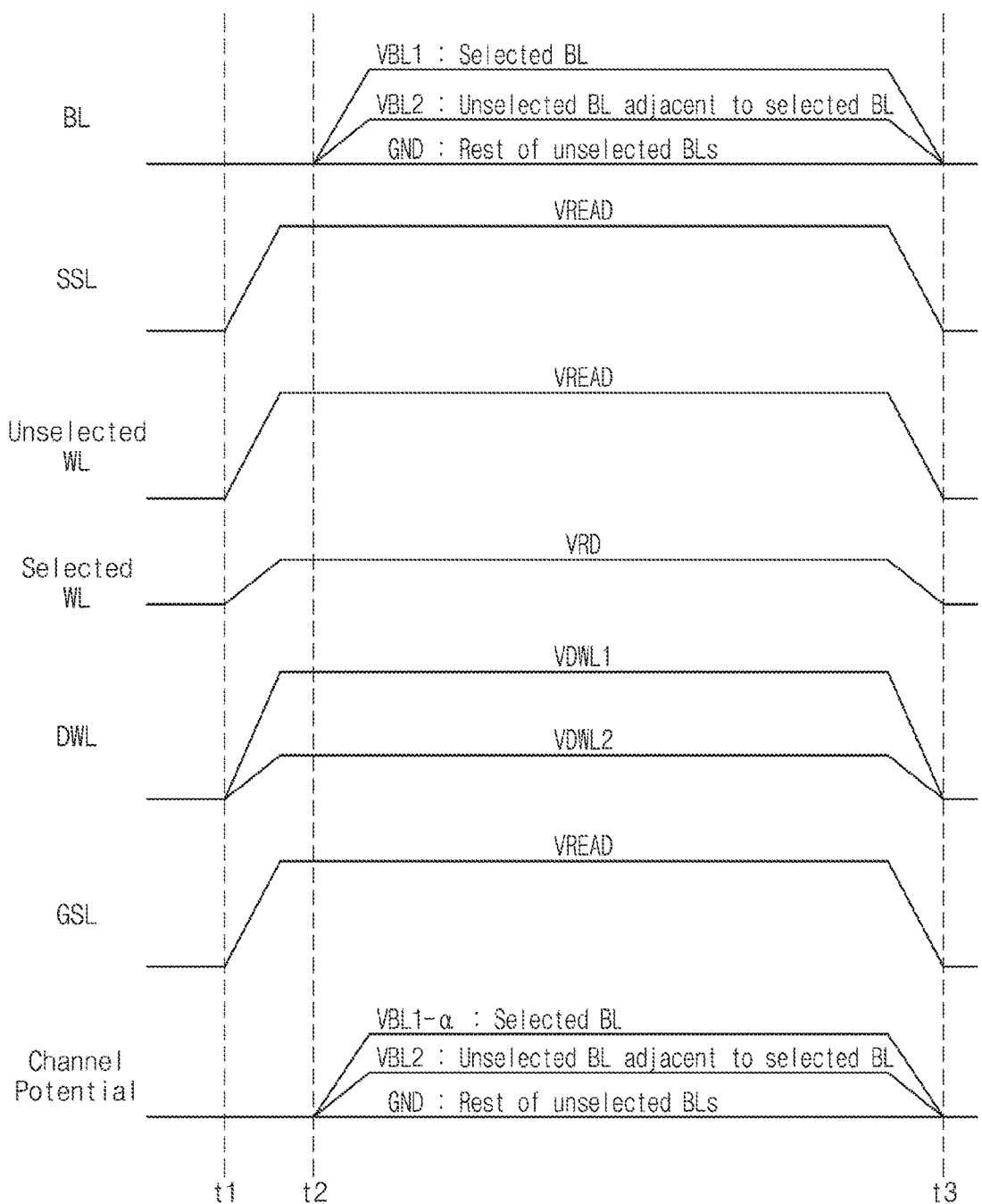
FIG. 14 is a timing diagram illustrating voltages applied in a read operation according to exemplary embodiments of the inventive concept.

FIG. 14 is a timing diagram illustrating voltages applied in a read operation according to exemplary embodiments of the inventive concept. Referring to FIG. 14, the nonvolatile memory device 100 may select a string select line of a selected memory block based on a received address ADDR in a read operation. A bias state associated with the selected string select line is described hereinafter.

At time t1, the nonvolatile memory device 100 may apply an unselect read voltage VREAD to a string select line SSL and a ground select line GSL. For example, the unselect read voltage VREAD is a voltage that can turn on memory cells connected to the string select line SSL and the ground select line GSL. The nonvolatile memory device 100 may apply a select read voltage VRD to a selected word line (Selected WL) and may apply the unselect read voltage VREAD to an unselected word line (Unselected WL). For example, the unselect read voltage VREAD is a voltage that can turn on memory cells connected to unselected word lines. The select read voltage VRD is a voltage for reading data stored in memory cells connected to the selected word line. In the case where the memory cells are multi-level cells, a plurality of select read voltages VRD may be used.

The nonvolatile memory device 100 may apply a first or second dummy word line voltage (VDWL1, VDWL2) to dummy word lines DWL depending on a location of a selected bit line. For example, as described in FIGS. 12 and 13, the nonvolatile memory device 100 may apply different dummy word line voltages to first and second dummy word lines (DWL1, DWL2) depending on whether the selected bit line is an odd bit line or an even bit line.

At time t2, the nonvolatile memory device 100 may apply a first bit line voltage VBL1 to the selected bit line to precharge the selected bit line. The nonvolatile memory device 100 may apply a second bit line voltage VBL2 to an unselected bit line adjacent to the selected bit line to form a channel potential of a channel connected to the unselected bit line (e.g., VBL2). The nonvolatile memory device 100 may apply a ground voltage GND to the remaining unselected bit lines to shield bit lines adjacent to the remaining unselected bit lines. The channel potential of the remaining unselected bit lines may be GND. The channel potential of the selected bit line may be VBL1-α.

Figure 15:
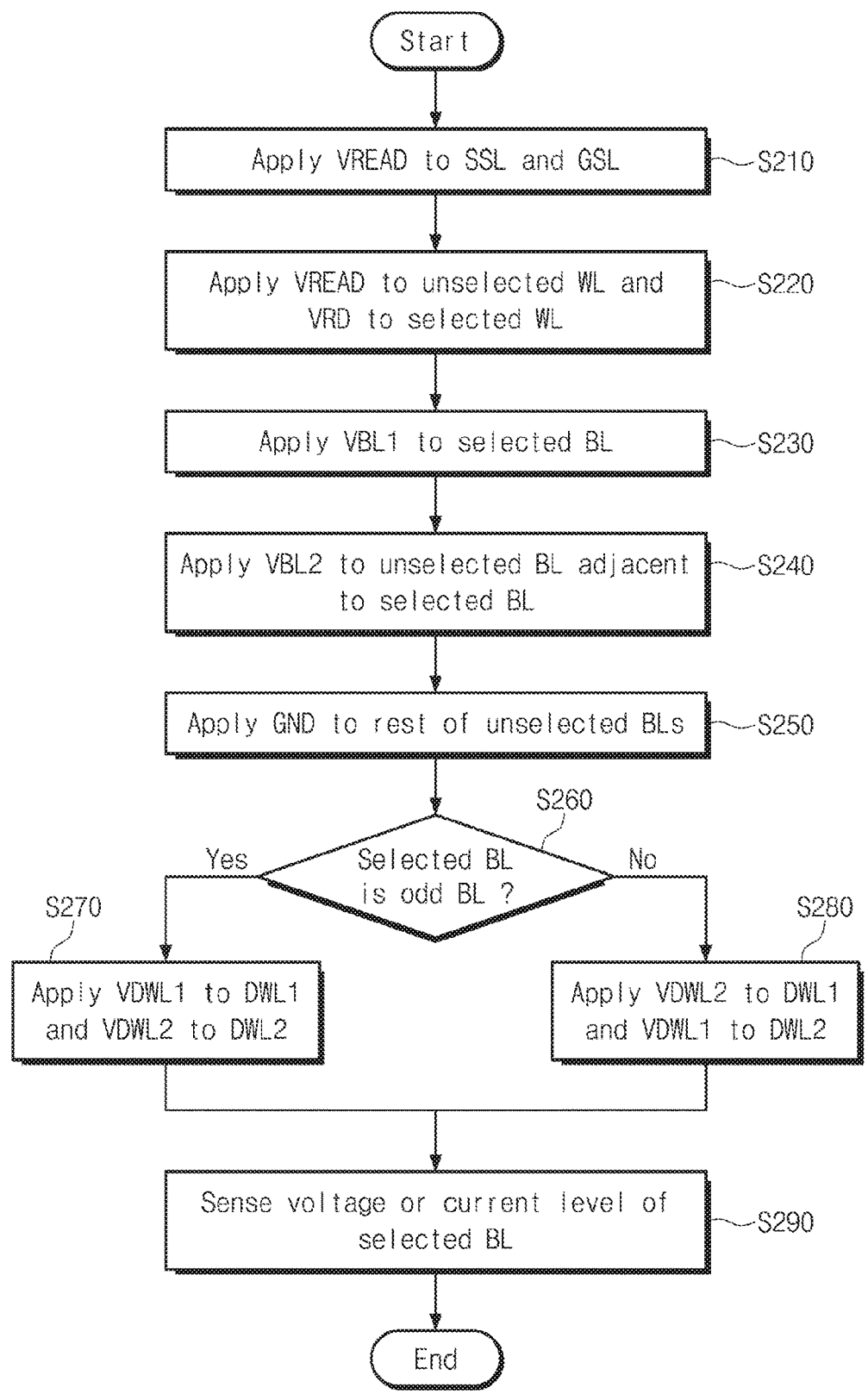
FIG. 15 is a flowchart illustrating a read operation according to exemplary embodiments of the inventive concept.

FIG. 15 is a flowchart illustrating a read operation according to exemplary embodiments of the inventive concept. Referring to FIG. 15, the nonvolatile memory device 100 may selectively read a part of one page from a selected memory block.

In an operation S210, the nonvolatile memory device 100 may apply an unselect read voltage VREAD to a string select line SSL and a ground select line GSL. For example, the unselect read voltage VREAD is a voltage that can turn on memory cells connected to the string select line SSL and the ground select line GSL.

In an operation S220, the nonvolatile memory device 100 may apply a select read voltage VRD to a selected word line and may apply the unselect read voltage VREAD to an unselected word line. For example, the unselect read voltage VREAD is a voltage that can turn on memory cells connected to unselected word lines. The select read voltage VRD is a voltage for reading data stored in memory cells connected to the selected word line.

In an operation S230, the nonvolatile memory device 100 may apply a first bit line voltage VBL1 to a selected bit line. For example, the first bit line voltage VBL1 is a precharge voltage for reading data stored in a memory cell connected to the selected bit line. In an operation S240, the nonvolatile memory device 100 may apply a second bit line voltage VBL2 to an unselected bit line adjacent to the selected bit line. In an operation S250, the nonvolatile memory device 100 may apply a ground voltage GND to the remaining unselected bit lines. For example, a plurality of bit lines may form a bit line group and the nonvolatile memory device 100 may select one bit line from among the bit line group in a read operation.

In an operation S260, the nonvolatile memory device 100 may determine whether the selected bit line is an odd bit line. In an operation S270, in the case where the selected bit line is an odd bit line, the nonvolatile memory device 100 may apply a first dummy word line voltage VDWL1 to a first dummy word line DWL1 and may apply a second dummy word line voltage VDWL2 to a second dummy word line DWL2. For example, when the first dummy word line voltage VDWL1 is applied to the first dummy word line DWL1, dummy memory cells connected to the first dummy word line DWL1 may be all turned on. When the second dummy word line voltage VDWL2 is applied to the second dummy word line DWL2, dummy memory cells connected to even bit lines among dummy memory cells connected to the second dummy word line DWL2 may be turned off. In an operation S280, in the case where the selected bit line is an even bit line, the nonvolatile memory device 100 may apply the second dummy word line voltage VDWL2 to the first dummy word line DWL1 and may apply the first dummy word line voltage VDWL1 to the second dummy word line DWL2. For example, when the first dummy word line voltage VDWL1 is applied to the second dummy word line DWL2, dummy memory cells connected to the second dummy word line DWL2 may be all turned on. When the second dummy word line voltage VDWL2 is applied to the first dummy word line DWL1, dummy memory cells connected to odd bit lines among dummy memory cells connected to the first dummy word line DWL1 may be turned off.

In an operation S290, the nonvolatile memory device 100 may measure a voltage or current level of the selected bit line. In other words, the nonvolatile memory device 100 may read data of a memory cell connected to the selected bit line and the selected word line. A cell string connected to the selected bit line has a channel potential corresponding to the first bit line voltage VBL1 and a cell string connected to the unselected bit line adjacent to the selected bit line has a channel potential corresponding to the second bit line voltage VBL2. Thus, the nonvolatile memory device 100 may reduce a read disturbance caused by a FN stress in a read operation by controlling the second bit line voltage VBL2.

Figure 16:
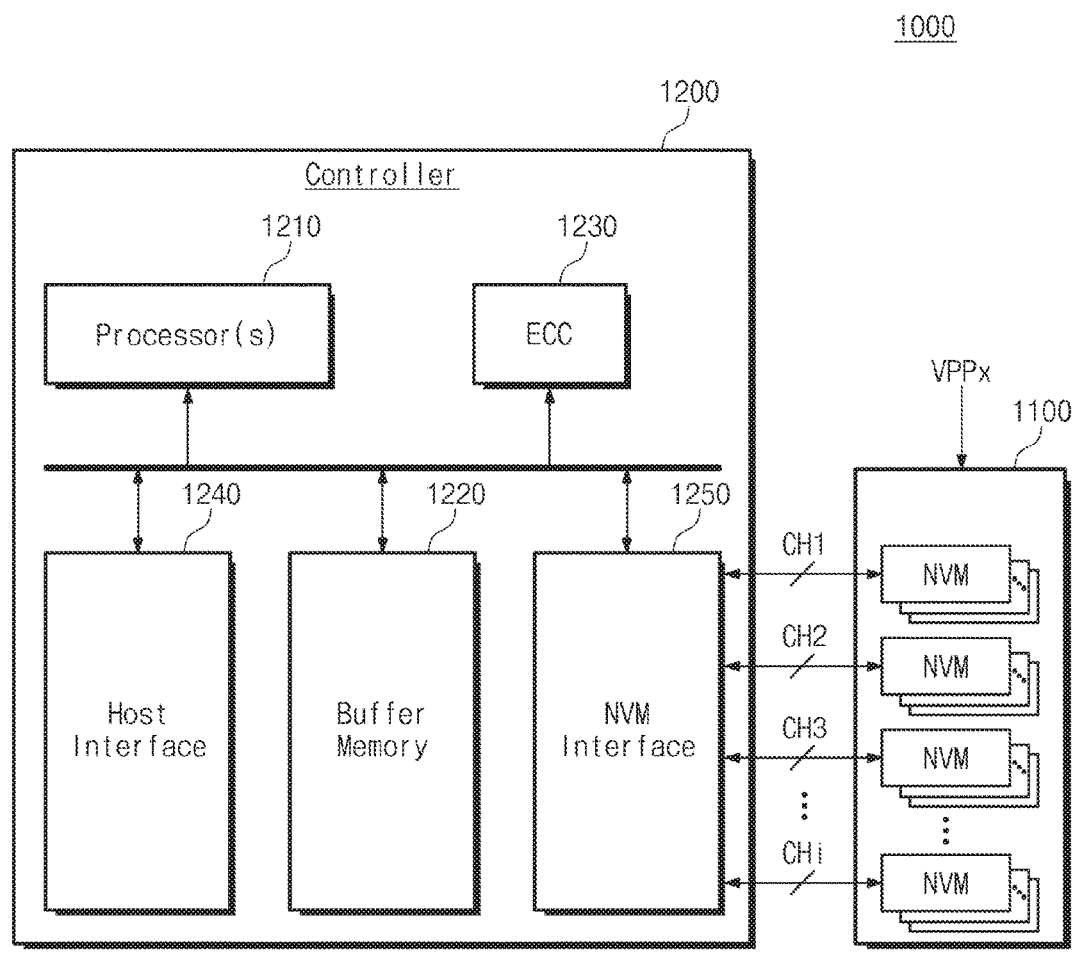
FIG. 16 is a block diagram illustrating a solid state drive (SSD) according to exemplary embodiments of the inventive concept.

FIG. 16 is a block diagram illustrating a solid state drive (SSD) according to exemplary embodiments of the inventive concept. The SSD 1000 may include a plurality of nonvolatile memory devices 1100 and a SSD controller 1200.

The nonvolatile memory devices 1100 may selectively receive an external high voltage Vppx. As described in FIGS. 1 through 15, in a read operation, each of the nonvolatile memory devices 1100 may partly read one page, and may prevent a read disturbance by reducing a difference of a channel potential between a selected cell string and an unselected cell string.

The SSD controller 1200 is connected to the nonvolatile memory devices 1100 through a plurality of channels (CH1 to CHi, i is an integer equal to or greater than 2). The SSD controller 1200 may include at least one processor 1210, a buffer memory 1220, an error correction circuit 1230, a host interface 1240, and a nonvolatile memory interface 1250.

The buffer memory 1220 may temporarily store data used to drive the SSD controller 1200. The buffer memory 1220 may include a plurality of memory lines that stores data or commands.

The error correction circuit 1230 may calculate an error correction code value of data to be programmed in a write operation, may correct an error of data read in a read operation based on the error correction code value, and may correct an error of data recovered from the nonvolatile memory devices 1100 in a data recovery operation. A code memory that stores code data used to drive the SSD controller 1200 may be further included. The code memory may be a nonvolatile memory device.

The host interface 1240 may provide a function that can interface with an external device. Here, the host interface 1240 may be a NAND interface. The nonvolatile memory interface 1250 may provide a function that can interface with the nonvolatile memory devices 1100.

Figure 17:
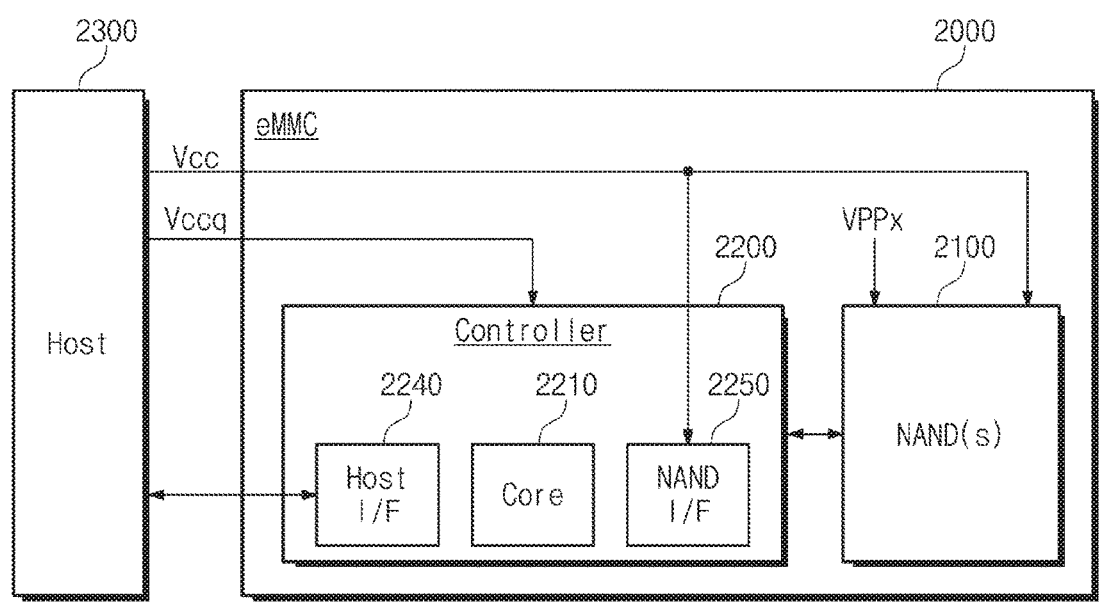
FIG. 17 is a block diagram illustrating an embedded multi-media card (eMMC) according to exemplary embodiments of the inventive concept.

FIG. 17 is a block diagram illustrating an embedded multimedia card (eMMC) according to exemplary embodiments of the inventive concept. Referring to FIG. 17, the eMMC 2000 may include at least one NAND flash memory device 2100 and a controller 2200.

The NAND flash memory device 2100 may be a single data rate (SDR) NAND or a double data rate (DDR) NAND. The NAND flash memory device 2100 may be a vertical NAND (VNAND). As described in FIGS. 1 through 15, in a read operation, the NAND flash memory device 2100 may partly read one page and may prevent a read disturbance by reducing a difference of a channel potential between a selected cell string and an unselected cell string.

The controller 2200 may be connected to the NAND flash memory device 2100 through a plurality of channels. The controller 2200 may include at least one controller core 2210, a host interface 2240, and a NAND interface 2250. The controller core 2210 may control an overall operation of the eMMC 2000. The host interface 2240 may perform an interface between the controller 2200 and a host 2300. The NAND interface 2250 may perform an interface between the NAND flash memory device 2100 and the controller 2200. In the present embodiment, the host interface 2240 may be a parallel interface (e.g., an MMC interface). In another embodiment, the host interface 2240 may be a serial interface (e.g., ultra-high speed II (UHS-II), universal flash storage (UFS) interface).

The eMMC 2000 may receive power supply voltages (Vcc, Vccq) from the host 2300. A first power supply voltage Vcc (e.g., 3.3V) may be provided to the NAND flash memory device 2100 and the NAND interface 2250, and a second power supply voltage Vccq (e.g., 1.8V/3.3V) may be provided to the controller 2200. In the present embodiment, the eMMC 2000 may selectively receive an external high voltage Vppx.

Figure 18:
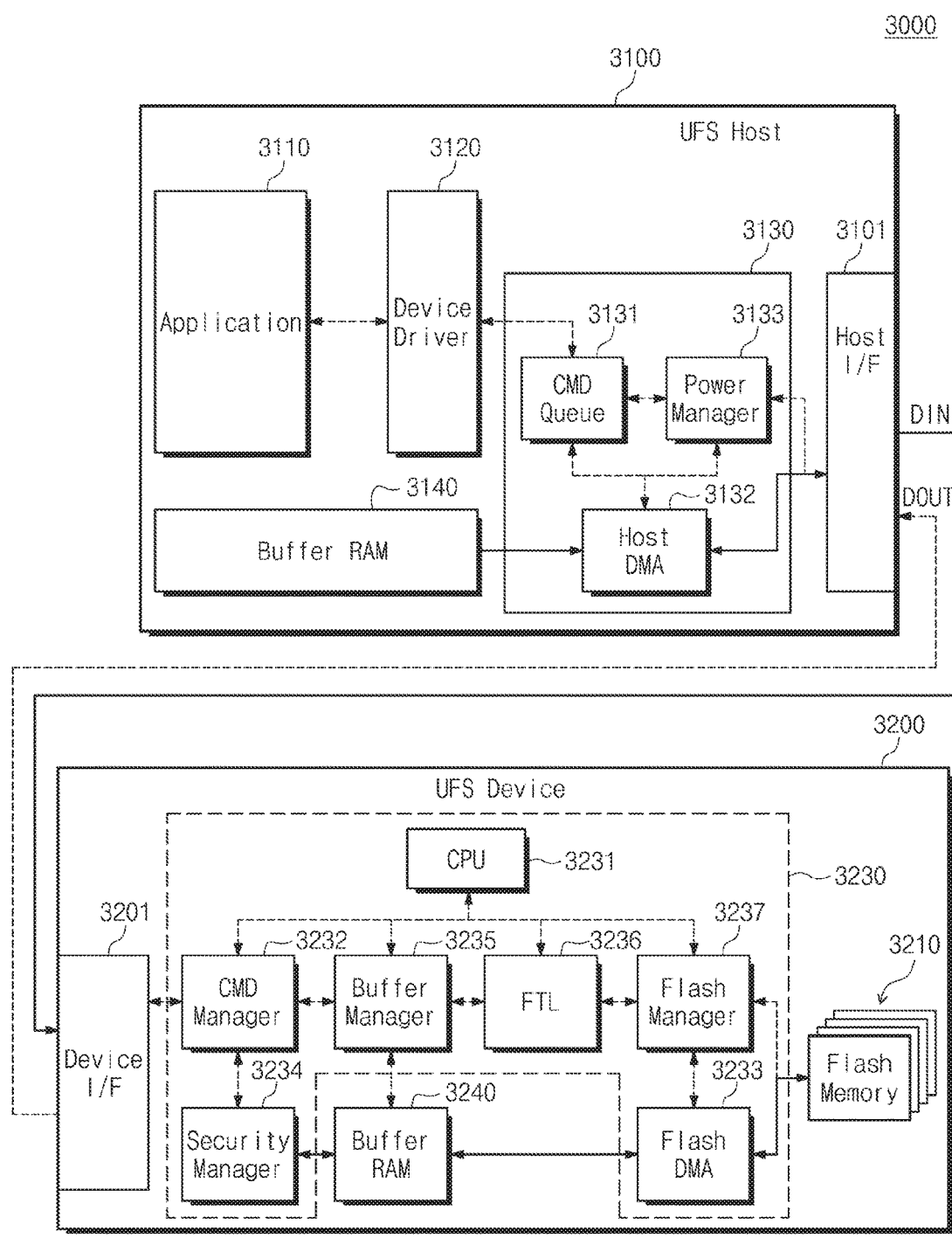
FIG. 18 is a block diagram illustrating a universal flash system (UFS) system according to exemplary embodiments of the inventive concept.

FIG. 18 is a block diagram illustrating a UFS system according to exemplary embodiments of the inventive concept. Referring to FIG. 18, a UFS system 3000 may include a UFS host 3100 and a UFS device 3200.

The UFS host 3100 may include an application 3110, a device driver 3120, a host controller 3130, and a buffer random access memory (RAM) 3140. The host controller 3130 may include a command queue 3131, a host direct memory access (DMA) 3132, and a power manager 3133. The command queue 3131, the host DMA 3132, and the power manager 3133 may operate as algorithm, software, or firmware in the host controller 3130.

A command (e.g., a write command) generated in the application 3110 and the device driver 3120 of the UFS host 3100 may be input to the command queue 3131 of the host controller 3130. The command queue 3131 may store commands to be provided to the UFS device 3200 in order. The host DMA 3132 sends a command to the UFS device 3200 through a host interface 3101.

Referring to FIG. 18, the UFS device 3200 may include a flash memory 3210, a device controller 3230, and a buffer RAM 3240. The device controller 3230 may include a central processing unit (CPU) 3231, a command manager 3232, a flash DMA 3233, a security manager 3234, a buffer manager 3235, a flash translation layer (FTL) 3236, and a flash manager 3237. Here, the command manager 3232, the security manager 3234, the buffer manager 3235, the FTL 3236, and the flash manager 3237 may operate as algorithm, software, or firmware in the device controller 3230.

As described in FIGS. 1 through 15, in a read operation, the flash memory 3210 may partly read one page and may prevent a read disturbance by reducing a channel potential difference between a selected cell string and an unselected cell string.

A command which is input from the UFS host 3100 to the UFS device 3200 may be provided to the command manager 3232 through a device interface 3201. The command manager 3232 may interpret a command provided from the UFS host 3100 and may authenticate the provided command using the security manager 3234. The command manager 3232 may allocate the buffer RAM 3240 to receive data through buffer manager 3235. When preparation of data transmission is complete, the command manager 3232 sends a Ready_To_Transfer (RTT) UPIU to the UFS host 3100.

The UFS host 3100 may transmit data (DOUT) to the UFS device 3200 in response to the RTT UPIU. The data may be transmitted to the UFS device 3200 through the host DMA 3132 and the host interface 3101. The UFS device 3200 may store the received data in the buffer RAM 3240 through the buffer manager 3235. The data stored in the buffer RAM 3240 may be provided to the flash manager 3237 through the flash DMA 3233. The flash manager 3237 may store data in a selected address of the flash memory 3210 with reference to address mapping information of the FTL 3236. Data (DIN) may be transmitted from the UFS device 3200 to the UFS host 3100.

When a data transmission and a program which is necessary for a command are complete, the UFS device 3200 sends a response that notifies a completion with respect to the command to the UFS host 3100 through an interface. The UFS host 3100 may notify the device driver 3120 and the application 3110 of the completion with respect to the command, and may finish an operation with respect to a corresponding command.

According to exemplary embodiments of the inventive concept, in a partial read operation, a nonvolatile memory device may apply a specific bit line voltage to a bit line of a string adjacent to a selected string to reduce a read disturbance between the selected string and the unselected string.

While the inventive concept has been described with reference to exemplary embodiments thereof, it will be apparent to those skilled in the art that various changes and modifications may be made thereto without departing from the spirit and scope of the inventive concept as defined by the claims. Therefore, it should be understood that the above embodiments are not limiting, but illustrative.

What is claimed is:

1. A nonvolatile memory device, comprising:
a first cell string including first memory cells and a first dummy cell that are stacked in a direction perpendicular to a substrate and connected to a selected string select line;
a second cell string including second memory cells and a second dummy cell that are stacked in the direction perpendicular to the substrate and connected to the selected string select line;
a third cell string including third memory cells and a third dummy cell that are stacked in the direction perpendicular to the substrate and connected to the selected string select line;
a fourth cell string including fourth memory cells and a fourth dummy cell that are stacked in the direction perpendicular to the substrate and connected to the selected string select line, wherein the fourth, first, second and third cell strings are sequentially arranged;
a page buffer circuit configured to select one of the first, second, third and fourth cell strings to read data in a read operation; and
a control logic circuit configured to apply a first bit line voltage to a bit line connected to the selected one of the first, second, third and fourth cell strings, and when the second cell string is selected the control logic applies a second bit line voltage to a bit line connected to the first and third cell strings, and applies a third bit line voltage to a bit line connected to the fourth cell string in the read operation,
wherein when the second cell string is selected, the control logic turns off the first and third dummy cells, and
wherein the second bit line voltage has a level lower than the first bit line voltage, and the third bit line voltage has a level lower than the second bit line voltage.

2. The nonvolatile memory device of claim 1, wherein the first dummy cell is connected to a first dummy word line and the second dummy cell is connected to a second dummy word line.

3. The nonvolatile memory device of claim 2, wherein when the first cell string is selected, the control logic circuit applies a first dummy word line voltage to the first dummy word line and a second dummy word line voltage to the second dummy word line.

4. The nonvolatile memory device of claim 3, wherein when the second cell string is selected, the control logic circuit applies the second dummy word line voltage to the first dummy word line and the first dummy word line voltage to the second dummy word line.

5. The nonvolatile memory device of claim 4, wherein the first and second dummy cells have a threshold voltage lower than the first dummy word line voltage.

6. The nonvolatile memory device of claim 4, wherein the first and second dummy cells have a threshold voltage higher than the second dummy word line voltage.

7. The nonvolatile memory device of claim 2,
wherein the third bit line voltage is a ground voltage.

8. The nonvolatile memory device of claim 7, wherein when the second cell string is selected, the fourth dummy cell is connected to the first dummy word line.

9. The nonvolatile memory device of claim 1, wherein the second cell string is adjacent to the first cell string.

10. A method of reading a nonvolatile memory device, the nonvolatile memory device including a first cell string including first memory cells and a first dummy cell that are stacked in a direction perpendicular to a substrate and connected to a selected string select line, and a second cell string including second memory cells and a second dummy cell that are stacked in the direction perpendicular to the substrate and connected to the selected string select line, the method comprising:
applying an unselect read voltage to unselected wordlines of the nonvolatile memory device and applying a select read voltage to a selected wordline of the nonvolatile memory device;
applying a first bit line voltage to a first bit line connected to the first cell string;
applying a second bit line voltage to a second bit line connected to the second cell string, wherein the first and second bit line voltages are applied after the unselect and select read voltages are applied;
when the first cell string is selected, applying a first dummy word line voltage to a first dummy word line connected to the first dummy cell and applying a second dummy word line voltage to a second dummy word line connected to the second dummy cell; and
sensing data stored in a selected memory cell of the first cell string,
wherein when the first cell string is selected, the first dummy cell is turned on and the second dummy cell is turned off.

11. The method of claim 10, wherein the second bit line voltage is lower than the first bit line voltage.

12. The method of claim 11, further comprising:
erasing the first and second cell strings; and
verifying a threshold voltage of each of the first and second dummy cells.

13. The method of claim 12, further comprising programming the threshold voltage of each of the first and second dummy cells to be between the first and second dummy word line voltages.

14. The method of claim 10, wherein the first and second dummy cells have a threshold voltage lower than the first dummy word line voltage.

15. The method of claim 10, wherein the first and second dummy cells have a threshold voltage higher than the second dummy word line voltage.

16. A nonvolatile memory device, comprising:
a first cell string including first memory cells and a first dummy cell that are stacked in a direction perpendicular to a substrate, wherein the first cell string is connected to a selected bit line;
a second cell string including second memory cells and a second dummy cell that are stacked in the direction perpendicular to the substrate, wherein the second cell string is connected to a first unselected bit line;
a third cell string including third memory cells and a third dummy cell that are stacked in the direction perpendicular to the substrate and connected to a second unselected bit line, wherein the first, second and third cell strings are sequentially arranged; and
a control logic circuit configured to apply a first bit line voltage to the selected bit line connected to the first cell string, a second bit line voltage to the first unselected bit line connected to the second cell string, and a third bit line voltage to the second unselected bit line connected to the third cell string in a read operation,
wherein the second bit line voltage is greater than the third bit line voltage and less than the first bit line voltage.

17. The nonvolatile memory device of claim 16, wherein the first and second cell strings are connected to a selected string selection line.

18. The nonvolatile memory device of claim 16, wherein the first and second cell strings are adjacent to each other.

19. The nonvolatile memory device of claim 16, wherein the second dummy cell is turned off by a dummy wordline voltage.

20. The nonvolatile memory device of claim 16, wherein a channel potential of a channel connected to the first unselected bit line corresponds to the second bit line voltage.

* * * * *